(12) United States Patent
Higby et al.

(10) Patent No.: US 11,765,816 B2
(45) Date of Patent: Sep. 19, 2023

(54) TAMPER-RESPONDENT ASSEMBLIES WITH PRESSURE CONNECTOR ASSEMBLIES

(71) Applicant: INTERNATIONAL BUSINESS MACHINES CORPORATION, Armonk, NY (US)

(72) Inventors: Arthur J. Higby, Cottekill, NY (US); William L. Brodsky, Binghamton, NY (US); Levi Campbell, Poughkeepsie, NY (US); David Clifford Long, Wappingers Falls, NY (US); James Busby, New Paltz, NY (US); Philipp K. Buchling Rego, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 253 days.

(21) Appl. No.: 17/399,302

(22) Filed: Aug. 11, 2021

(65) Prior Publication Data

US 2023/0052840 A1     Feb. 16, 2023

(51) Int. Cl.
*H05K 1/02*   (2006.01)
*H05K 5/03*   (2006.01)

(52) U.S. Cl.
CPC ......... *H05K 1/0275* (2013.01); *H05K 1/0213* (2013.01); *H05K 5/03* (2013.01)

(58) Field of Classification Search
CPC ...... H05K 1/0213; H05K 1/0275; H05K 1/02; H05K 5/03; H05K 2201/10265;
(Continued)

(56) References Cited

U.S. PATENT DOCUMENTS 6,853,093 B2   2/2005   Cohen et al.
7,323,986 B2   1/2008   Hunter et al.
(Continued)

FOREIGN PATENT DOCUMENTS

WO   WO 2017/003413 A1   1/2017
WO   WO 2020/051910 A1   3/2020

OTHER PUBLICATIONS

Immler et al., "Secure Physical Enclosures from Covers with Tamper-Resistance", IACR Transactions on Cryptographic Hardware and Embedded Systems, ISSN 2569-2925, vol. 2019, No. 1, pp. 51-96 (Year: 2019).

*Primary Examiner* — Timothy J Thompson
*Assistant Examiner* — Guillermo J Egoavil
(74) *Attorney, Agent, or Firm* — Tihon Poltavets, Esq.; Kevin P. Radigan, Esq.; HESLIN ROTHENBERG FARLEY & MESITI P.C.

(57) ABSTRACT

Tamper-respondent assemblies are provided which include an enclosure mounted to a circuit board and enclosing one or more components to be protected within a secure volume. A tamper-respondent sensor covers, at least in part, an inner surface of the enclosure, and includes at least one tamper-detect circuit. A monitor circuit is disposed within the secure volume to monitor the tamper-detect circuit(s) for a tamper event. A pressure connector assembly is also disposed within the secure volume, between the tamper-respondent sensor and the circuit board. The pressure connector assembly includes a conductive pressure connector electrically connecting, at least in part, the monitor circuit and the tamper-detect circuit(s) of the tamper-respondent assembly, and a spring-biasing mechanism to facilitate breaking electrical connection of the conductive pressure connector to the tamper-detect circuit(s) with a tamper event.

20 Claims, 16 Drawing Sheets

(58) Field of Classification Search
CPC ......... H05K 2201/10371; H05K 1/028; H05K 1/167; H05K 1/185; H05K 3/1233; H05K 3/366; H05K 3/4697; H05K 2201/066; H05K 2201/09036; H05K 2201/0919; H05K 2201/09227; H05K 2201/09236; H05K 2201/09263; H05K 2201/0999; H05K 2201/10151; H05K 2203/0271; G08B 13/06; G08B 13/149
USPC .............................................. 361/1; 324/693
See application file for complete search history.

(56) References Cited

U.S. PATENT DOCUMENTS

| | | | |
|---|---|---|---|
| 8,270,174 | B2 | 9/2012 | Wimmer |
| 9,521,764 | B2 | 12/2016 | Steiner |
| 10,321,589 | B2 | 6/2019 | Dragone et al. |
| 10,327,329 | B2 | 6/2019 | Busby et al. |
| 2006/0049941 | A1* | 3/2006 | Hunter .................. G08B 13/08 340/545.6 |
| 2006/0133580 | A1* | 6/2006 | Vezina ................. A61G 1/0287 378/177 |
| 2018/0235081 | A1* | 8/2018 | Brodsky ................ G08B 13/06 |
| 2020/0034576 | A1 | 1/2020 | Etchells et al. |

\* cited by examiner

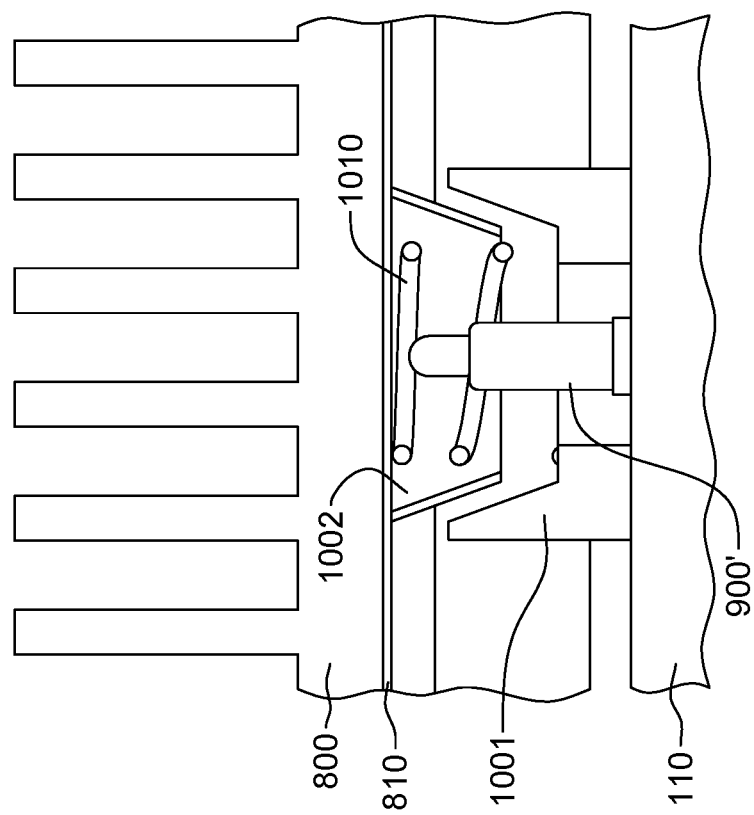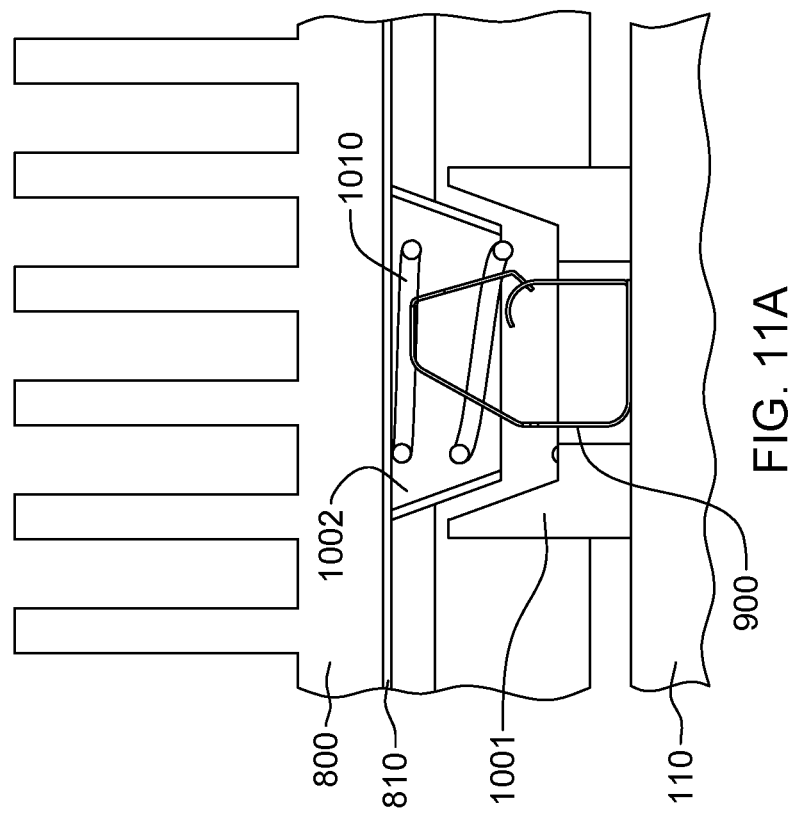

TAMPER-RESPONDENT ASSEMBLIES WITH PRESSURE CONNECTOR ASSEMBLIES

BACKGROUND

Many activities require secure electronic communications. To facilitate secure electronic communications, an encryption/decryption system can be implemented on an electronic assembly or circuit board assembly that is included in equipment connected to a communications network. Such an electronic assembly is an enticing target for malefactors since it may contain codes or keys to decrypt intercepted messages, or to encode fraudulent messages. To prevent this, the electronic assembly can be mounted in an enclosure, which is then wrapped in a security sensor and encapsulated with polyurethane resin. The security sensor can be, in one or more embodiments, a web or sheet of insulating material with circuit elements, such as closely-spaced, conductive lines fabricated on it. The circuit elements are disrupted if the sensor is torn, and the tear can be sensed in order to generate an alarm signal. The alarm signal can be conveyed to a monitor circuit in order to reveal an attack on the integrity of the assembly, triggering an erasure of encryption/decryption keys stored within the electronic assembly.

SUMMARY

Certain shortcomings of the prior art are overcome and additional advantages are provided through the provision, in one or more aspects, of a tamper-respondent assembly, which includes an enclosure, a tamper-respondent sensor, a monitor circuit, and a pressure connector assembly. The enclosure is mounted to a circuit board and encloses one or more components to be protected within a secure volume, and the tamper-respondent sensor covers, at least in part, an inner surface of the enclosure. The tamper-respondent sensor includes at least one tamper-detect circuit. The monitor circuit is disposed within the secure volume to monitor the at least one tamper-detect circuit of the tamper-respondent sensor for tampering, and the pressure connector assembly is disposed within the secure volume, between the tamper-respondent sensor and the circuit board. The pressure connector assembly includes a conductive pressure connector electrically connecting the monitor circuit and the at least one tamper-detect circuit of the tamper-respondent assembly, and a spring-biasing mechanism to facilitate breaking electrical connection of the conductive pressure connector to the at least one tamper-detect circuit with a tamper event.

In another aspect, a tamper-respondent assembly is provided which includes an enclosure, a tamper-respondent sensor, a monitor, and multiple pressure connector assemblies. The enclosure is mounted to a circuit board and encloses one or more components to be protected within a secure volume, and the tamper-respondent sensor covers, at least in part, an inner surface of the enclosure. The monitor circuit is disposed within the secure volume to monitor the at least one tamper-detect circuit of the tamper-respondent sensor for tampering, and the multiple pressure connector assemblies are disposed within the secure volume, between the tamper-respondent sensor and the circuit board to electrically connect the at least one tamper-detect circuit and the monitor circuit. A pressure connector assembly of the multiple pressure connector assemblies includes a conductive pressure connector electrically connecting the monitor circuit and the at least one tamper-detect circuit of the tamper-respondent assembly, and a spring-biasing mechanism to facilitate breaking electrical connection of the conductive pressure connector to the at least one tamper-detect circuit with a tamper event.

In a further aspect, a method of fabricating a tamper-respondent assembly is provided. The method includes obtaining a circuit board, the circuit board including one or more electronic components to be protected, and mounting an enclosure to the circuit board to enclose the one or more electronic components within a secure volume. The method further includes providing a tamper-respondent sensor covering, at least in part, an inner surface of the enclosure, the tamper-respondent sensor including at least one tamper-detect circuit, and providing a monitor circuit disposed within the secure volume to monitor the at least one tamper-detect circuit of the tamper-respondent sensor for tampering. Further, the method includes providing a pressure connector assembly disposed within the secure volume, between the tamper-respondent sensor and the circuit board. The pressure connector assembly includes a conductive pressure connector electrically connecting the monitor circuit and the at least one tamper-detect circuit of the tamper-respondent assembly, and a spring-biasing mechanism to facilitate breaking electrical connection of the conductive pressure connector to the at least one tamper-detect circuit with a tamper event.

Additional features and advantages are realized through the techniques described herein. Other embodiments and aspects of the invention are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 11A depicts a partial embodiment of assembling a tamper-respondent assembly with a pressure connector assembly, in accordance with one or more aspects of the present invention;

FIG. 11B depicts another partial embodiment of assembling a tamper-respondent assembly with a pressure connector assembly, in accordance with one or more aspects of the present invention;

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, wherein the same reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application, for instance, of a tamper-respondent assembly.

Disclosed herein are certain novel tamper-respondent assemblies to, for instance, facilitate secure electronic communications using encryption/decryption systems. In one or more implementations, various tamper-respondent assemblies and methods of fabrication are disclosed which provide, for instance, a security Level 4 secure volume for accommodating one or more electronic components, such as one or more encryption and/or decryption modules and associated components of, for instance, a communications card or other electronic assembly to be protected, which can provide enhanced tamper protection. FIGS. 1A-8 depict various aspects of a tamper-respondent assembly such as disclosed herein, and FIGS. 9A-14C disclose pressure connector assembly embodiments for use within tamper-respondent assemblies, such as described.

Figure 1A:
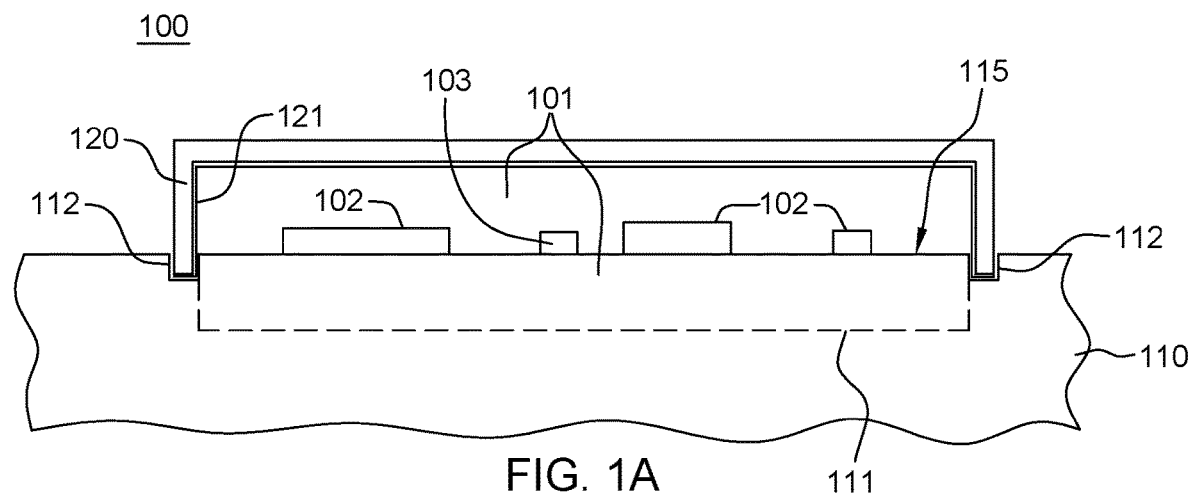
FIG. 1A is a cross-sectional elevational view of one embodiment of a tamper-proof electronic package, or tamper-respondent assembly, which can include one or more pressure connector assemblies in accordance with one or more aspects of the present invention.
Figure 1B:
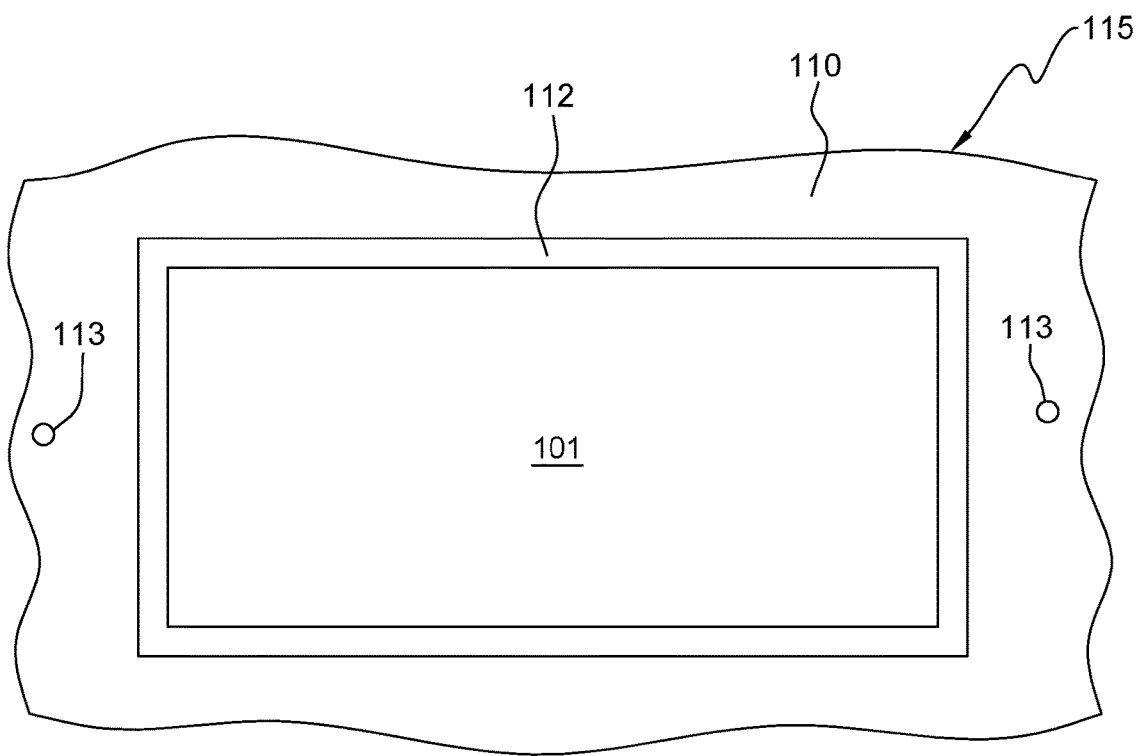
FIG. 1B is a top plan view of the multilayer circuit board of FIG. 1A.

Referring to FIGS. 1A & 1B, one embodiment of a tamper-proof electronic package or tamper-respondent assembly 100 is depicted, which includes one or more electronic components, such as a circuit 115 and/or electronic devices (or elements) 102 coupled to a multilayer circuit board 110.

Referring collectively to FIGS. 1A & 1B, circuit 115 resides on or is embedded within multilayer circuit board 110, which also has an embedded tamper-respondent sensor 111 that facilitates defining, in part, a secure volume 101 associated with multilayer circuit board 110 that (in one or more embodiments) extends into multilayer circuit board 110. In particular, in the embodiment of FIGS. 1A & 1B, secure volume 101 can exist partially within multilayer circuit board 110, and partially above multilayer circuit board 110. One or more electronic devices 102 are mounted to multilayer circuit board 110 within secure volume 101 and can include, for instance, one or more encryption modules and/or decryption modules, and/or associated components, to be protected within the tamper-proof electronic package. In one or more implementations, the one or more electronic components to be protected can include, for instance, components of a secure communications card of a computer system.

Tamper-proof electronic package 100 further includes an enclosure 120, such as a pedestal-type enclosure, mounted to multilayer circuit board 110 within, for instance, a continuous groove (or trench) 112 formed within an upper surface of multilayer circuit board 110, and secured to the multilayer circuit board 110 via, for instance, a structural adhesive disposed within continuous groove 112. In one or more embodiments, enclosure 120 can be made of a thermally conductive material to operate as a heat sink for facilitating cooling of the one or more electronic components 102 within the secure volume. A security mesh or tamper-respondent sensor 121 can be associated with enclosure 120, for example, wrapping around the inner surface of enclosure 120, to facilitate defining, in combination with tamper-respondent sensor 111 embedded within multilayer circuit board 110, secure volume 101. In one or more other implementations, enclosure 120 can be securely affixed to a surface of multilayer circuit board 110 (without a continuous groove) using, for instance, a bonding material such as an epoxy or other adhesive.

Briefly described, tamper-respondent sensor 121 can include, in one or more examples, one or more tamper-detection layers which include circuit lines or traces provided on one or both sides of a structural layer, which in one or more implementations, can be a flexible insulating layer or film. The circuit lines on one or both sides of the flexible layer can be of a line width and have a pitch or line-to-line spacing such that piercing of the layer at any point results in damage to one or more of the circuit lines or traces. In one or more implementations, the circuit lines can define one or more conductors which can be electrically connected in a network to a monitor circuit or detector 103, which monitors, for instance, resistance on the lines. Detection of a change in resistance caused by cutting or damaging one or more of the lines, will cause information within the secure volume to be automatically erased. The conductive lines of the tamper-respondent sensor can be in any desired pattern, such as a sinusoidal pattern, to make it more difficult to breach the tamper-detection layer without detection.

For resistive monitoring, a variety of materials can be employed to form the circuit lines. For instance, the circuit lines can be formed of a metal or metal alloy, such as copper, or silver, or can be formed, for example, of an intrinsically-conductive polymer, carbon ink, or nickel phosphorous (NiP), or Omega-ply®, offered by Omega Technologies, Inc., of Culver City, California (USA), or Ticer™, offered by Ticer Technologies, Chandler, Arizona (USA). The process employed to form the fine circuit lines or traces is dependent, in part, on the choice of materials used for the circuit lines. For instance, if copper circuit lines are fabricated, then additive processing, such as plating of copper traces, or subtractive processing, such as etching away unwanted copper between trace lines, can be employed.

As noted, in one or more implementations, the circuit lines of the tamper-respondent sensor(s) lining the inner surface(s) of enclosure 120, or even printed directly onto one or more layers formed over the inner surface of enclosure 120, can be connected to define one or more tamper-detect circuits or networks.

If a flexible layer is used over the inner surface of enclosure 120, then the flexible layer can be formed of a crystalline polymer material. For instance, the crystalline polymer could include polyvinylidene difluoride (PVDF), or Kapton, or other crystalline polymer material. Advantageously, a crystalline polymer can be made much thinner, while still maintaining structural integrity of the flexible substrate, which also allows for enhanced folding, and greater reliability of the sensor after folding.

As depicted in FIG. 1B, one or more external circuit connection vias 113 can be provided within multilayer circuit board 110 for electrically connecting to the one or more electronic components within secure volume 101. These one or more external circuit connection vias 113 can electrically connect to one or more external signal lines or planes (not shown) embedded within multilayer circuit board 110 and extending, for instance, into a secure base region of (or below) secure volume 101. Electrical connections to and from secure volume 101 can be provided by coupling to such external signal lines or planes within the multilayer circuit board 110.

As noted, secure volume 101 can be sized to house one or more electronic components to be protected and can be constructed to extend into multilayer circuit board 110. In one or more implementations, multilayer circuit board 110 includes electrical interconnect within the secure volume 101 defined in the board, for instance, for electrically connecting one or more tamper-detection layers of the embedded tamper-respondent sensor 111 to associated monitor circuitry also disposed within secure volume 101, along with, for instance, one or more daughter cards, such as memory DIMMs, PCIe cards, processor cards, etc.

Note that the packaging embodiment depicted in FIGS. 1A & 1B is presented by way of example only. Other configurations of enclosure 120, or multilayer circuit board 110 can be employed, and/or other approaches to coupling enclosure 120 and multilayer circuit board 110 can be used. For instance, in one or more alternate implementations, enclosure 120 can be securely affixed to an upper surface of multilayer circuit board 110 (without a continuous groove) using, for instance, a structural bonding material such as an epoxy or other adhesive.

Figure 2:
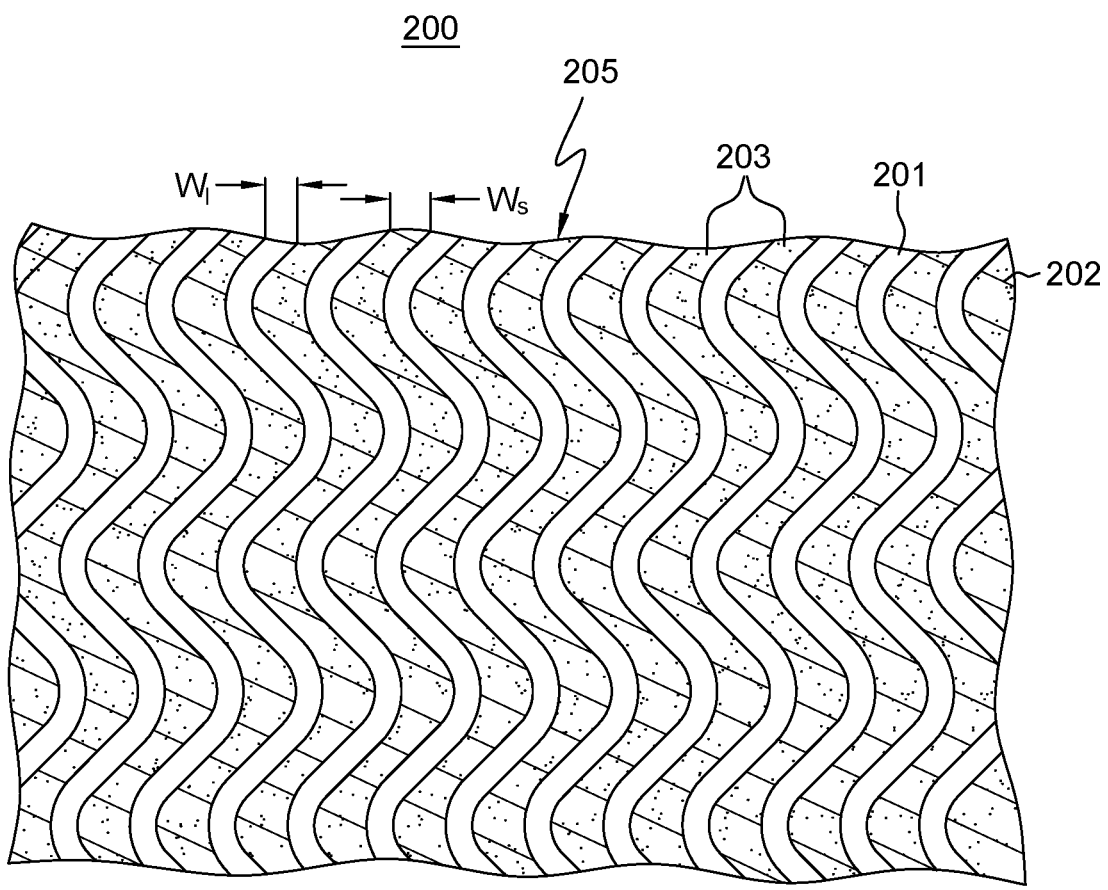
FIG. 2 depicts one embodiment of a tamper-respondent sensor with conductive lines forming, at least in part, at least one tamper-detect circuit of a tamper-respondent assembly, in accordance with one or more aspects of the present invention.

FIG. 2 depicts a portion of one embodiment of a tamper-detection layer 205 (or laser and pierce-respondent layer) of a tamper-respondent sensor 200 or security sensor. In FIG. 2, tamper-detection layer 205 includes tamper-detect circuit lines or traces 201 provided on one or both opposite sides of a layer, such as a flexible layer 202, which in one or more embodiments, can be a flexible insulating layer or film.

FIG. 2 illustrates circuit lines 201 on, for instance, one side of flexible layer 202, with the traces on the opposite side of the film being, for instance, the same pattern, but (in one or more embodiments) offset to lie directly below spaces 203, between circuit lines 201. As described below, the circuit lines on one side of the flexible layer can be of a line width $W_l$ and have a pitch or line-to-line spacing $W_s$ such that piercing of the layer 205 at any point results in damage to at least one of the circuit lines traces 201. In one or more implementations, the circuit lines can be electrically connected in-series or parallel to define one or more conductors which can be electrically connected in a network to a monitor circuit, which can, in one or more implementations, monitor the resistance of the lines. In one embodiment, detection of an increase, or other change, in resistance, caused by cutting or damaging one of the traces, will cause information within the encryption and/or decryption module to be erased. Providing conductive lines 201 in a pattern, such as a sinusoidal pattern, can advantageously make it more difficult to breach tamper-detection layer 205 without detection. Note, in this regard, that conductive lines 201 can be provided in any desired pattern. For instance, in an alternate implementation, conductive lines 201 can be provided as parallel, straight conductive lines, if desired, and the pattern or orientation of the pattern can vary between sides of a layer, and/or between layers.

As intrusion technology continues to evolve, anti-intrusion technology needs to continue to improve to stay ahead. In one or more implementations, tamper-respondent sensor 200 of FIG. 2 can cover or line an inner surface of an enclosure to provide a secure volume about at least one electronic component to be protected. Further, the tamper-respondent sensor, or more particularly, the tamper-detect circuit(s) of the sensor, can be embedded within a multilayer circuit board, such as described below.

Note also that a variety of materials can advantageously be employed to form the circuit lines. For instance, the circuit lines can be formed of a conductive ink (such as a carbon-loaded conductive ink) printed onto one or both opposite sides of one or more of the flexible layers 202 in a stack of such layers. Alternatively, a metal or metal alloy can be used to form the circuit lines, such as copper, silver, intrinsically conductive polymers, carbon ink, or nickel-phosphorus (NiP), such as Omega-Ply®, offered by Omega Technologies, Inc. of Culver City, California (USA), or nickel-chrome, such as Ticer™ offered by Ticer Technologies, Chandler, Arizona (USA). Note that the process employed to form the fine circuit lines or traces on the order described herein is dependent, in part, on the choice of material used for the circuit lines. For instance, if copper circuit lines are being fabricated, then additive processing, such as plating up copper traces, or subtractive processing, such as etching away unwanted copper between trace lines, can be employed.

Figure 3:
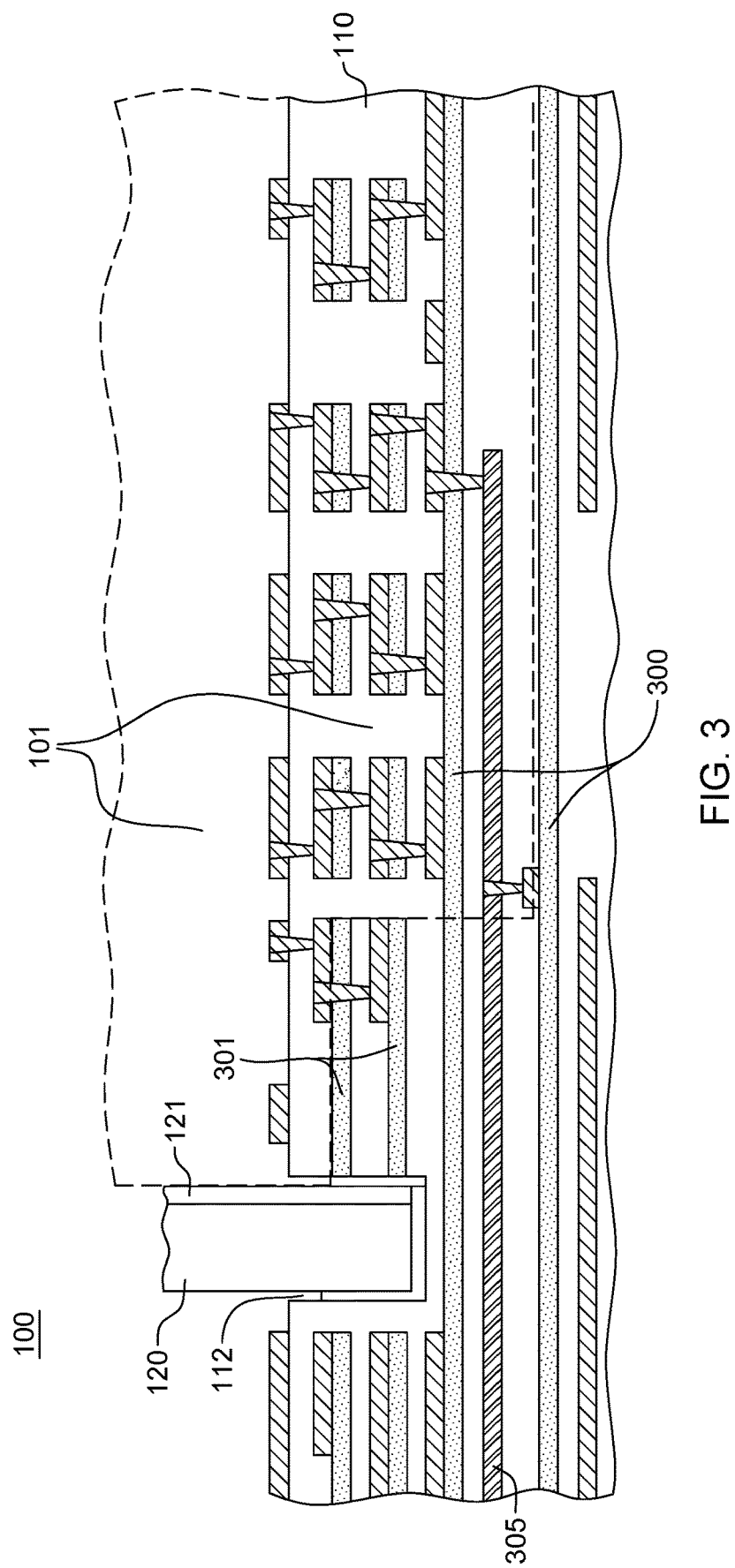
FIG. 3 is a partial cross-sectional elevational view of a more detailed embodiment of a tamper-respondent assembly, which can include one or more pressure connector assemblies in accordance with one or more aspects of the present invention.

By way of further example, FIG. 3 depicts a partial cross-sectional elevational view of a more detailed embodiment of tamper-proof electronic package 100, and in particular, of multilayer circuit board 110, to which enclosure 120 is secured. In this configuration, the embedded tamper-respondent sensor includes multiple tamper-detection layers including, by way of example, at least one tamper-detection mat (or base) layer 300, and at least one tamper-detection frame 301. In the example depicted, two tamper-detection mat layers 300 and two tamper-detection frames 301 are illustrated, by way of example only. The lower-most tamper-detection mat layer 300 can be a continuous sense or detect layer extending completely below the secure volume being defined within and/or above multilayer circuit board 110. One or both tamper-detection mat layers 300 below secure volume 101 can be partitioned into multiple circuit zones, if desired. Within each tamper-detection mat layer, or more particularly, within each circuit zone of each tamper-detection mat layer, multiple circuits or conductive traces can be provided in any desired configuration. Further, the conductive traces within the tamper-detection layers can be implemented as, for instance, a resistive layer.

As illustrated, one or more external signal lines or planes 305 can enter secure volume 101 between, in one embodiment, two tamper-detection mat layers 300, and then electrically connect upwards into the secure volume 101 through one or more conductive vias, arranged in any desired location and pattern. In the configuration depicted, the one or more tamper-detection frames 301 are disposed at least inside of the area defined by continuous groove 112 accommodating the base of enclosure 120. Together with the tamper-respondent sensor(s) 121 associated with enclosure 120, tamper-detection frames 301, and tamper-detection mat layers 300, define secure volume 101, which can extend, in part, into multilayer circuit board 110. With secure volume 101 defined, in part, within multilayer circuit board 110, the external signal line(s) 305 can be securely electrically connected to, for instance, the one or more electronic components mounted to, or of, multilayer circuit board 110 within secure volume 101. In addition, secure volume 101 can accommodate electrical interconnection of the conductive traces of the multiple tamper-detection layers 300, 301, for instance, via appropriate monitor circuitry.

Added security can be provided by extending tamper-detection mat layers 300 (and if desired, tamper-detection frames 301) outward past the periphery of enclosure 120. In this manner, a line of attack can be made more difficult at the interface between enclosure 120 and multilayer circuit board 110 since the attack would need to clear, for instance, tamper-detection mat layers 300, the enclosure 120, as well as the tamper-detection frames 301 of the embedded tamper-detect circuit.

Numerous variations on multilayer circuit board 110 of FIGS. 1A-2 are possible. For instance, in one embodiment, the embedded tamper-detect circuit can include one or more tamper-detection mat layers 300 and one or more tamper-detection frames 301, such as described above, and a tri-plate structure comprising one or more external signal lines or layers sandwiched between an upper ground plane and a lower ground plane. In this configuration, high-speed transfer of signals to and from the secure volume, and in particular, to and from the one or more electronic components resident within the secure volume, can be facilitated.

Figure 4:
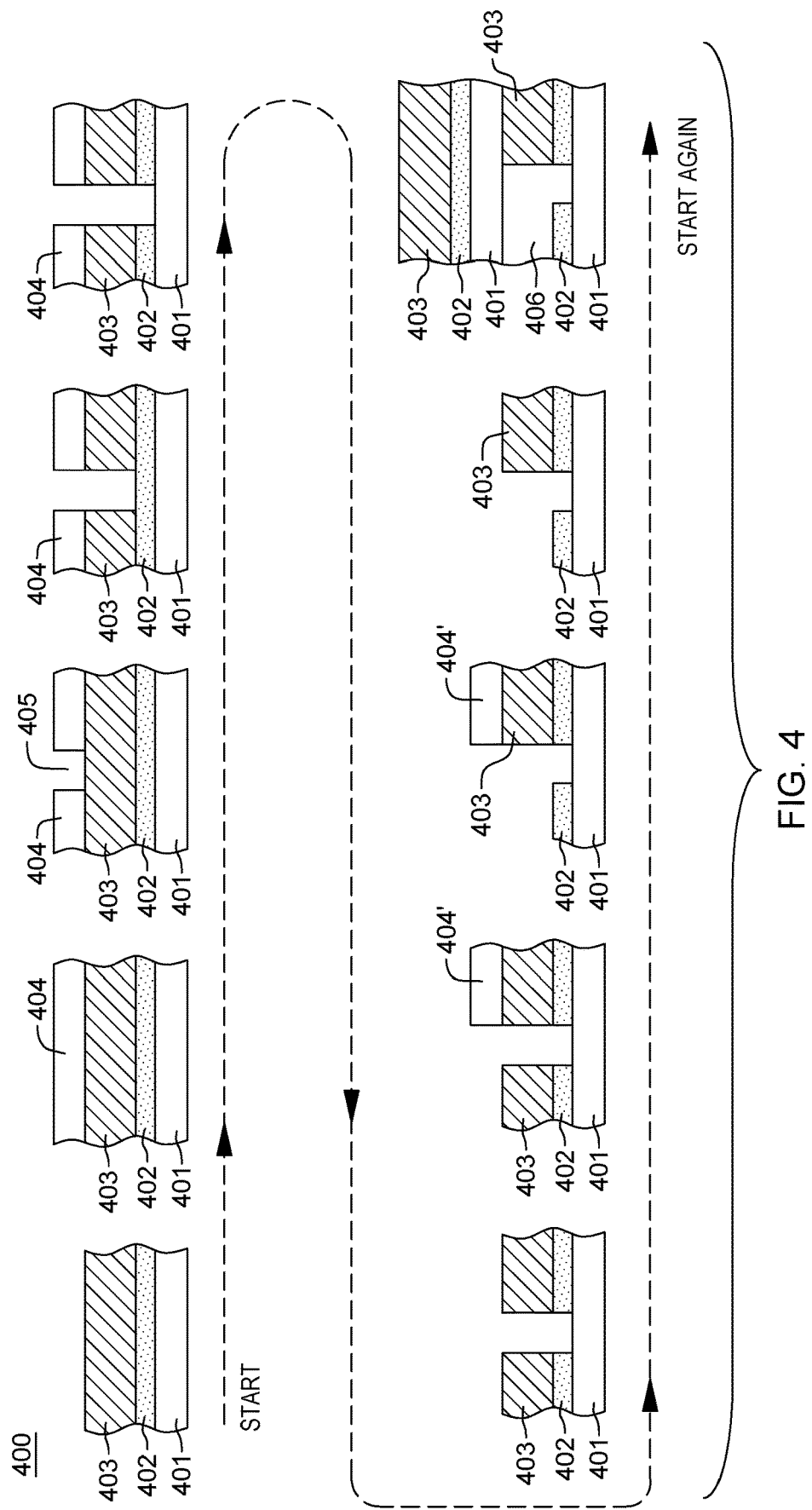
FIG. 4 depicts one embodiment of a process of fabricating a multilayer circuit board with an embedded tamper-detect circuit of a tamper-respondent assembly, in accordance with one or more aspects of the present invention.

In one or more implementations, the multilayer circuit board can be a multilayer wiring board or printed circuit board, or card, formed, for instance, by building up the multiple layers of the board. FIG. 4 illustrates one embodiment for forming and patterning a tamper-detection layer within such a multilayer circuit board.

As illustrated in FIG. 4, in one or more implementations, a tamper-detection layer, such as a tamper-detection mat layer or a tamper-detection frame disclosed herein, can be formed by providing a material stack comprising, at least in part, a structural layer 401, such as a pre-preg (or pre-impregnated) material layer, a trace material layer 402 for use in defining the desired trace patterns, and an overlying conductive material layer 403, to be patterned to define conductive contacts or vias electrically connecting to the pattern of traces being formed within the trace material layer 402, for instance, at trace terminal points. In one or more implementations, the trace material layer 402 can include nickel phosphorous (NiP), and the overlying conductive layer 403 can include copper. Note that these materials are identified by way of example only, and that other trace and/or conductive materials may be used within the build-up 400.

A first photoresist 404 is provided over build-up 400, and patterned with one or more openings 405, through which the overlying conductive layer 403 can be etched. Depending on the materials employed, and the etch processes used, a second etch process can be desired to remove portions of trace material layer 402 to define the conductive traces of the subject tamper-detection layer. First photoresist 404 can then be removed, and a second photoresist 404' is provided over the conductive layer 403 features to remain, such as the input and output contacts. Exposed portions of conductive layer 403 are then etched, and the second photoresist 404' can be removed, with any opening in the layer being filled, for instance, with an adhesive (or pre-preg) 406 and a next build-up layer is provided, as shown. Note that in this implementation, most of overlying conductive layer 403 is etched away, with only the conductive contacts or vias remaining where desired, for instance, at the terminal points of the traces formed within the layer by the patterning of the trace material layer 402. Note that any of a variety of materials can be employed to form the conductive lines or traces within a tamper-detection layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which can be employed include OhmegaPly®, offered by Ohmega Technologies, Inc., of Culver City, California (USA), or Ticer™, offered by Ticer Technologies of Chandler, Arizona (USA).

The trace lines or circuits within the tamper-detection layers, and in particular, the tamper-detection circuit zones, of the embedded tamper-detect circuit, along with the tamper detector monitoring the enclosure, can be electrically connected to monitor circuitry provided, for instance, within secure volume 101 (FIG. 1A) of the tamper-respondent assembly. The monitor circuitry can include various bridges or compare circuits, and conventional printed wiring board electrical interconnect inside secure volume 101 (FIG. 1A), for instance, located within the secure volume defined by the tamper-detection frames 301 (FIG. 3), and the tamper-detection mat layers 300 (FIG. 3).

Note that advantageously, different tamper-detection circuit zones on different tamper-detection layers can be electrically interconnected into, for instance, a common tamper-detect circuitry. Thus, any of a large number of interconnect configurations are possible. Note also, that the power supply or battery for the tamper-respondent sensor(s) can be located internal or external to the secure volume, with the sensor being configured in one or more embodiments to trip and destroy any protected or critical data if the power supply or battery is tampered with.

Figure 5:
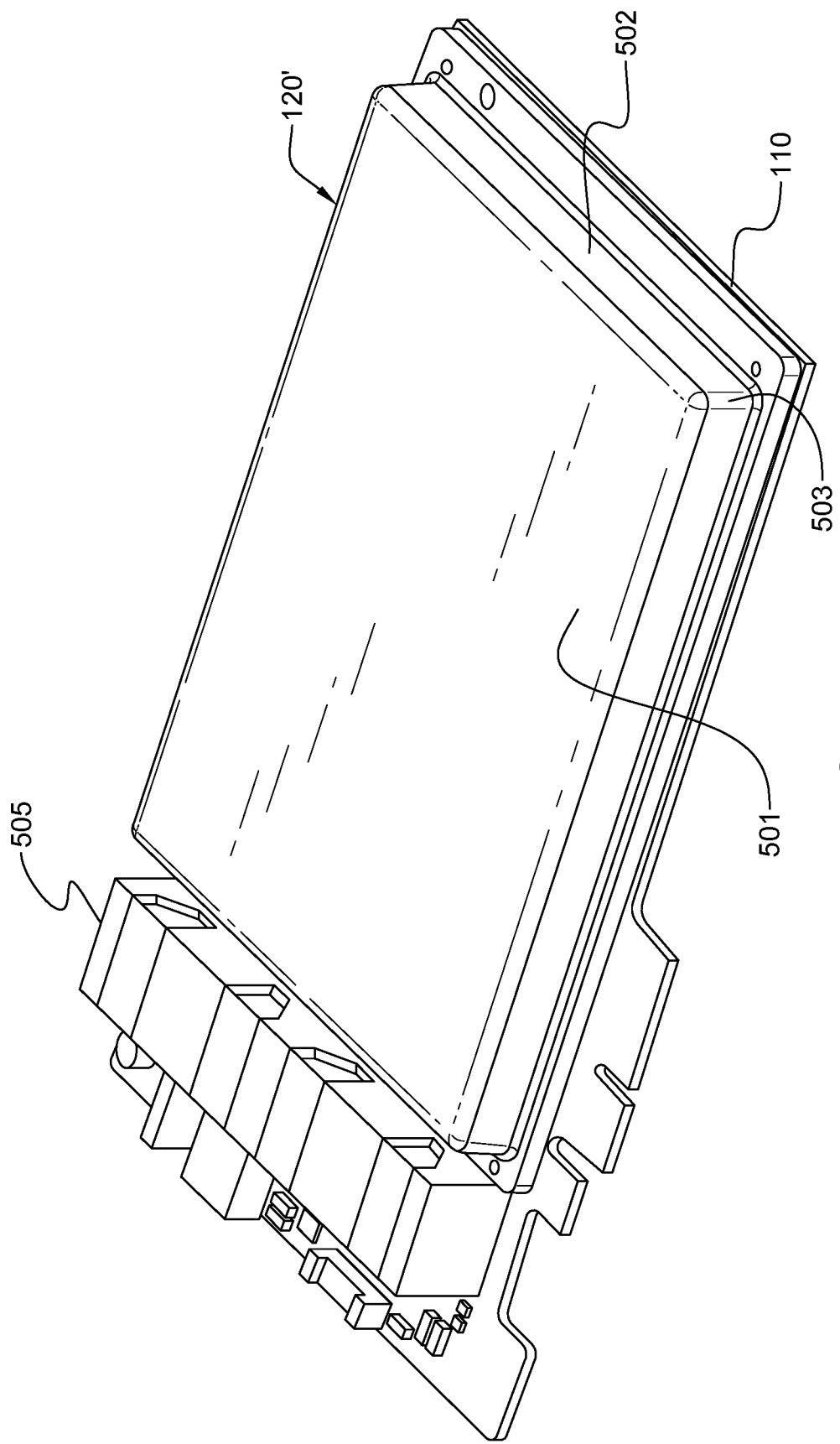
FIG. 5 is an isometric view of one embodiment of a tamper-respondent assembly, in accordance with one or more aspects of the present invention.
Figure 6:
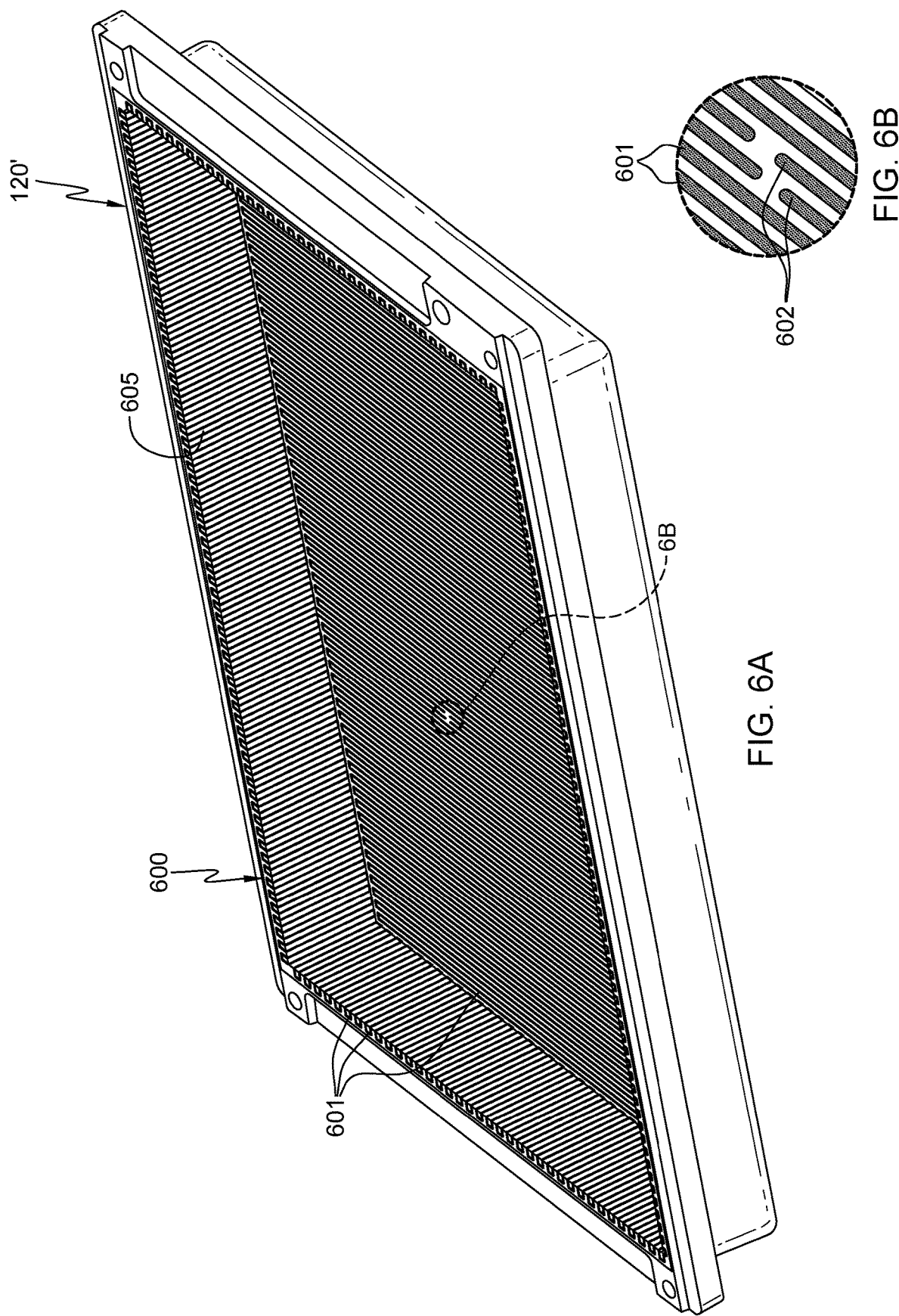
FIG. 6A is an inner isometric view of one embodiment of an enclosure of a tamper-respondent assembly having a tamper-detect sensor covering, at least in part, and inner surface of the enclosure, in accordance with one or more aspects of the present invention.
FIG. 6B is a partial enlarged depiction of the tamper-respondent assembly of FIG. 6A, taken along line 6B thereof, in accordance with one or more aspects of the present invention.

By way of further example, an isometric view of one embodiment of a tamper-respondent assembly is depicted in FIG. 5, where an enclosure 120' (similar to enclosure 120 of FIG. 1A) is shown sealed to multilayer circuit board 110 to define a secure volume about one or more electronic components. In the embodiment depicted, enclosure 120' is formed of a thermally conductive material, and includes a main surface 501 and sidewall(s) 502 which include sidewall corners 503. An inner surface of enclosure 500 includes an inner main surface, and an inner sidewall surface corresponding to main surface 501 and sidewall(s) 502 respectively, with the inner main surface and inner sidewall surfaces being covered, in one embodiment, by one or more tamper-respondent sensors, that is, in an embodiment such as described above in connection with FIGS. 1A-2. A power supply 505 or battery for the tamper-respondent sensor can be located, as depicted in this embodiment, external to the secure volume, with the tamper detector being configured to destroy any protected or critical data if the power supply or battery is tampered with. Enclosure 120' can be adhered to multilayer circuit board 110, which as noted herein, can include its own tamper protection in a variety of configurations.

When considering tamper-proof packaging, the electronic package needs to achieve defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-2 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs).

FIGS. 6A & 6B depict another embodiment of an enclosure 120' for a tamper-proof electronic package, such as described above in connection with FIGS. 1A-5. Enclosure 120' facilitates, in one or more embodiments, establishing a secure volume about one or more electronic components to be protected by mounting to, for instance, a multilayer circuit board, such as the multilayer circuit board described above (which as noted, can include one or more embedded tamper-detect sensor(s)). As illustrated, enclosure 120' includes an inner surface 605, such as the depicted inner main surface and inner sidewall surfaces, which are covered by tamper-detect circuit lines 601 of a tamper-respondent sensor 600. In one embodiment, tamper-respondent sensor 600 is a flexible tamper-detect sensor similar to sensors 121, 200 described above and coupled to cover, at least in part, the inner surface of enclosure 120'. For instance, in one embodiment, one or more tamper-respondent sensors 600 can be adhesively coupled to the inner surface of enclosure 120'. In the illustrated embodiment, circuit line ends 602 (FIG. 6B) are depicted, to which electrical contact is to be made to facilitate connection to a monitor circuit providing, for instance, a DC signal to the tamper-detect circuit lines to monitor the lines for a tamper event.

FIGS. 7A & 7B depict the partial tamper-respondent assembly of FIGS. 6A & 6B, with one embodiment of a sensor connection adapter 700 coupled to tamper-detect circuit lines 601 of tamper-respondent sensor 600. In one or more embodiments, sensor connection adapter 700 facilitates electrical connection between the monitor circuit of the tamper-respondent assembly and the circuit lines of the tamper-respondent sensor. As noted, the monitor circuit can be, by way of example, disposed within the secure volume defined by the tamper-respondent assembly, such as on the multilayer circuit board to which enclosure 120' is to be secured. In the embodiment illustrated, sensor connection adapter 700 includes a carrier 701, with circuit lines 702 disposed on (or within) carrier 701. In one example, carrier 701 can be a thin, rigid substrate or plate formed of, for instance, glass, ceramic, molded plate, etc., and circuit lines 702 can be formed of any conductive material.

In the illustrated embodiment, sensor connection adapter 700 electrically connects to circuit line ends 602 of lines 601 via one or more first connectors 710, and electrically connects to the monitor circuit (not shown) via, at least in part, one or more second connectors 720. Note that as used herein, the first and second connectors can refer to first and second electrical connections, and may be provided as different connector or connection types or adapters. For instance, the first connector(s) 710 can each be a connector type such as a wire-bond connector, a solder-ball connector, a spring connector, a zebra-strip connector, etc., and the second connector(s) can be, or include, a ribbon cable connector, such as illustrated in FIG. 7A. In implementation, sensor connection adapter 700 adapts the line width and/or pitch of sensor lines 601 to the line width and/or pitch of the second connector(s) 720.

As noted, second connector 720 can electrically connect to a monitor circuit or tamper detector disposed within the secure volume of the tamper-respondent assembly, such as mounted to a surface of the multilayer circuit board to which enclosure 120' is secured. Should the monitor circuit detect a tamper event, then in one or more embodiments, the monitor circuit signals one or more electronic components within the secure volume to erase any protected or critical data, based on detection of the tamper event.

Figure 8:
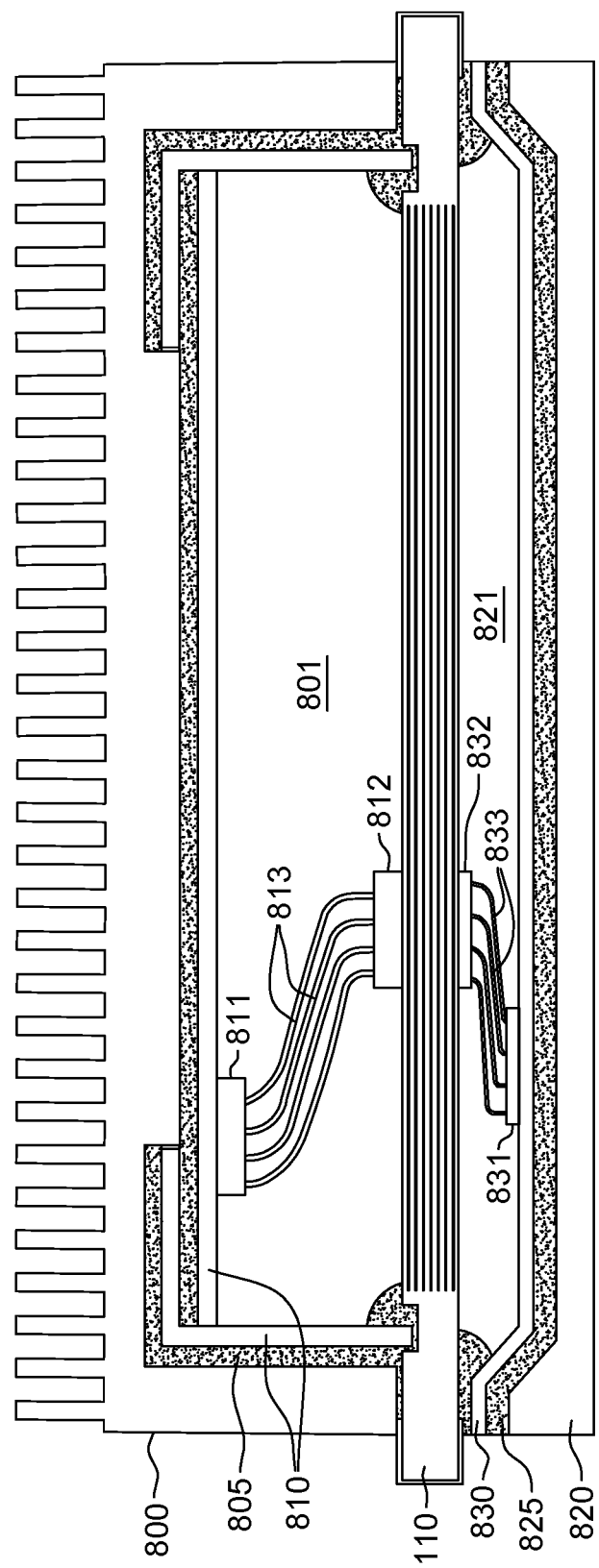
FIG. 8 depicts an elevational view of another embodiment of a tamper-respondent assembly, in accordance with one or more aspects of the present invention.

FIG. 8 depicts a further embodiment of a tamper-respondent assembly defining, for instance, a security Level 4 secure volume for accommodating one or more electronic components, such as one or more encryption and/or decryption modules and associated components of, for instance, a communications card or other electronic assembly to be protected. The tamper-respondent assembly is similar to the tamper-respondent assemblies described above, and includes, in one embodiment, a circuit board 110 with an enclosure 800 mounted to one side, and another enclosure 820 mounted to the opposite side of circuit board 110, such that secure volumes 801 and 821 are defined at opposite sides of circuit board 110. As described above, circuit board 110 can include, in one or more embodiments, conductive traces provided to form, at least in part, one or more tamper-detect circuits within circuit board 110 to facilitate defining secure volumes 801, 821 on the opposite sides of circuit board 110. Enclosures 800, 820 mount to circuit board 110, in one embodiment, using an enclosure-to-card structural adhesive at the interface between the respective enclosure and the circuit board.

One or more tamper-respondent sensors 810 are provided covering, at least in part, an inner surface of enclosure 800, and one or more tamper-respondent sensors 830 are provided covering, at least in part, an inner surface of enclosure 820. In one or more embodiments, tamper-respondent sensors 810, 830 are similar to tamper-respondent sensors 121, 200 & 600 described above, and as noted, are provided with one or more tamper-detect circuits for detecting an attempted tamper event into the respective secure volume 801, 821. Tamper-respondent sensors 810, 830 can be adhesively 805, 825 secured to the respective enclosure.

In the depicted embodiment, a connector assembly is shown which includes a connector 811 and a connector 812 provided within secure volume 801, which are interconnected via connector cables 813 to facilitate electrical connection of the monitor circuit disposed within the secure volume to the tamper-detect circuit(s) of tamper-respondent sensors 810. A similar assembly is provided within secure volume 821, where connectors 831, 832 are provided, electrically interconnected via connector cables 833. In operation, one or more monitor circuits within secure volume 801, 821 monitor integrity of the respective tamper-respondent sensors 810, 830, and in particular, monitor the respective tamper-detect circuits via the respective connector cables. With any attempted tamper event into the secure volume, there will be a tearing or shorting of one or more of the traces in the tamper-detect circuits, which is detected by the monitor circuitry, and results in deletion of any critical data in response to the detection.

Figure 7:
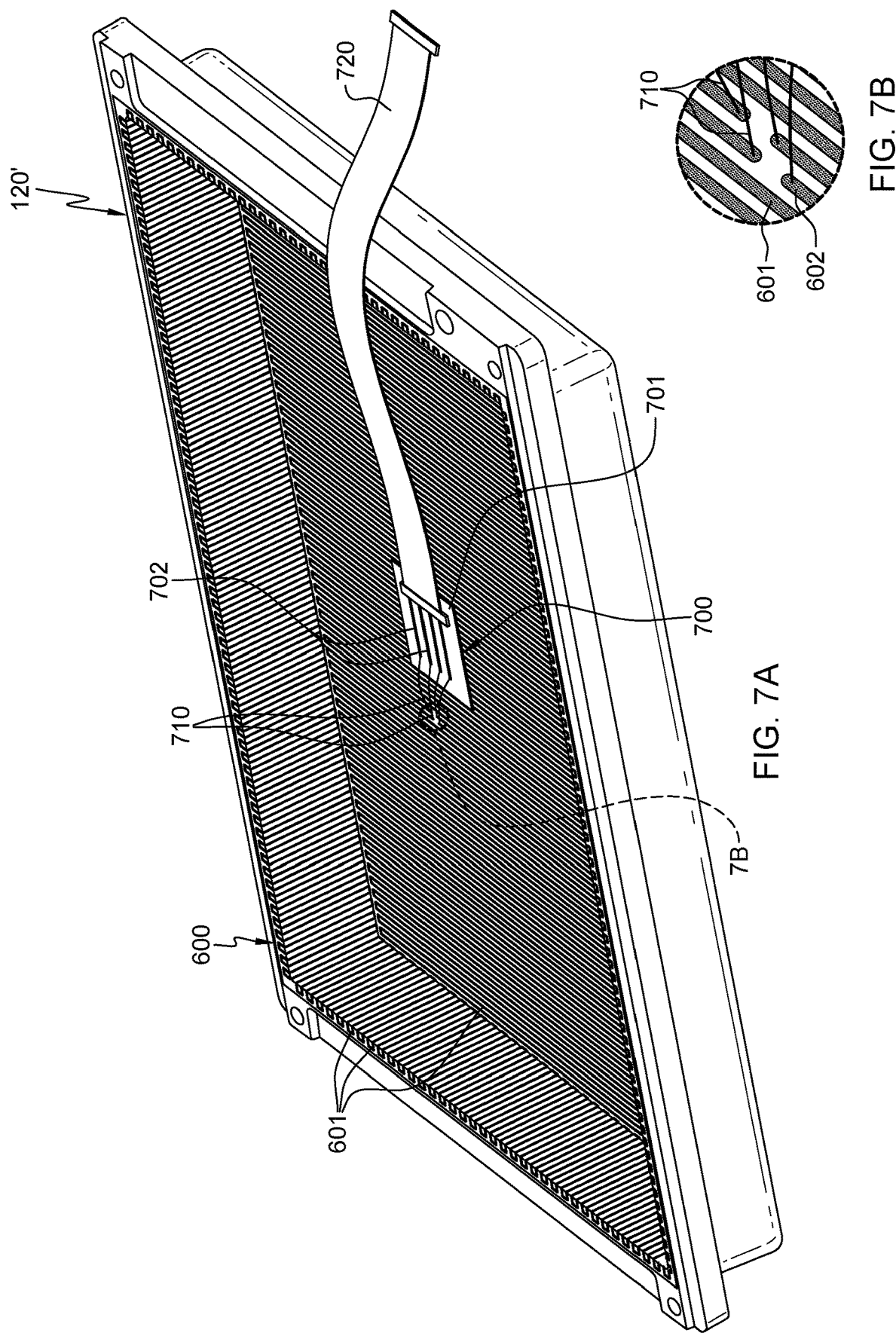
FIG. 7A is an inner isometric view of the enclosure and tamper-respondent sensor of FIG. 6A, with a sensor connection adapter shown coupled to the enclosure.
FIG. 7B is a partial enlarged depiction of the enclosure and tamper-respondent sensor of FIG. 7A, taken along line 7B thereof.

There are potential issues with cable designs such as illustrated in FIGS. 7A-8. For instance, due to space constraints inside the secure volumes, the connector cables can potentially cross during encapsulation, and over time, wire insulation could cold-flow, allowing two or more wires to short together, causing a false tamper event. Further, if a malefactor attempts to break into a secure volume of the tamper-respondent assembly, and is able to successfully remove the enclosure on either side of the multilayer circuit board, without damaging any of the tamper-detect circuitry, the connectors and connector cables can still be connected, and the tamper-detect circuit would still be active, with the one or more components to be protected at greater risk of a successful tampering.

Disclosed herein, in one or more aspects, are enhanced tamper-respondent assemblies which include an enclosure, a tamper-respondent sensor, a monitor circuit, and one or more pressure connector assemblies. The enclosure is mounted to a circuit board and encloses one or more components to be protected within a secure volume. The tamper-respondent sensor covers, at least in part, an inner surface of the enclosure, with the tamper-respondent sensor including at least one tamper-detect circuit. The monitor circuit is disposed within the secure volume to monitor the at least one tamper-detect circuit of the tamper-respondent sensor for tampering. The one or more pressure connector assemblies are disposed within the secure volume, between the tamper-respondent sensor and the circuit board. In one embodiment, a pressure connector assembly includes a conductive pressure connector electrically connecting the monitor circuit and the at least one tamper-detect circuit of the tamper-respondent assembly, and a spring-biasing mechanism to facilitate breaking electrical connection of the conductive pressure connector to the at least one tamper-detect circuit with a tamper event, such as with removal of the enclosure from over the tamper-respondent sensor, where the conductive pressure connector electrically connects to the tamper-detect circuit.

In one or more embodiments, the pressure connector assembly further includes an alignment feature, where the alignment feature facilitates aligning the conductive pressure connector to a contact pad of the at least one tamper-detect circuit of the tamper-respondent sensor. In one implementation, the spring-biasing mechanism includes a spring disposed within the alignment feature, where the spring biases the tamper-respondent sensor away from the conductive pressure connector with removal of the enclosure from over the tamper-respondent sensor above the conductive pressure connector.

In one or more implementations, the alignment feature includes a base alignment feature secured to the circuit board within the secure volume, and a circuit alignment feature coupled to the tamper-respondent sensor within the secure volume. The circuit alignment feature mates with the base alignment feature with mounting of the enclosure to the circuit board to facilitate aligning the conductive pressure connector to the respective contact pad of the at least one tamper-detect circuit. In certain embodiments, the spring-biasing mechanism includes a spring residing between the base alignment feature and the tamper-respondent sensor. In one or more implementations, the base alignment feature has a central opening, and the circuit alignment feature projects into the central alignment opening of the base alignment feature with mounting of the enclosure to the circuit board to facilitate aligning the conductive pressure connector to the contact pad of the at least one tamper-detect circuit. In one embodiment, the circuit alignment feature includes a conical-shaped alignment feature, and the conductive pressure connector extends through a central opening of the conical-shaped alignment feature to contact the contact pad of the at least one tamper-detect circuit.

In one embodiment, the conductive pressure connector resides within a central opening of the alignment feature of the pressure connector assembly. Additionally, in one implementation, the conductive pressure connector further resides, at least in part, within a central opening in the spring-biasing mechanism.

In one or more embodiments, the tamper-respondent assembly includes multiple pressure connector assemblies disposed within the secure volume, between the tamper-respondent sensor and the circuit board. The pressure connector assembly is one pressure connector assembly of the multiple pressure connector assemblies, and the one pressure connector assembly further includes an alignment feature. The alignment feature facilitates aligning the conductive pressure connector to a contact pad of the at least one tamper-detect circuit of the tamper-respondent sensor, and includes a base alignment feature, where the spring-biasing mechanism includes a spring disposed between the base alignment feature and the tamper-respondent sensor.

In one or more embodiments, a tamper-respondent assembly and method of fabrication are provided herein, with a spring-biasing mechanism which counteracts mechanical pressure-coupling of a conductive pressure connector between a tamper-respondent sensor and a connector coupled to monitor circuitry of the assembly. By way of example, the tamper-respondent assembly includes an enclosure disposed over a circuit board, with a flex security sensor, or tamper-respondent sensor, positioned over an inner surface of the enclosure, and with a protruding circuit alignment feature extending into the secure volume of the tamper-respondent assembly from the sensor. A base alignment feature extends upwards from a surface of the circuit board, and the circuit alignment feature and base alignment feature at least partially align and engage with mounting of the enclosure to the board to facilitate aligning the pressure connector assembly, and in particular, the conductive pressure connector of the assembly, to a respective contact pad of the at least one tamper-detect circuit of the tamper-respondent sensor. A spring-biasing mechanism, such as a spring, is disposed between the alignment features, and is compressible with mounting of the enclosure to the circuit board. The conductive pressure connector, in one embodiment, is disposed between the alignment features, for instance, within a central opening in each alignment feature, and is sized to electrically connect, at least in part, the monitor circuit and the at least one tamper-detect circuit. The spring-biasing mechanism facilitates breaking electrical connection of the conductive pressure connector to the at least one tamper-detect circuit with certain tamper events.

Figure 9B:
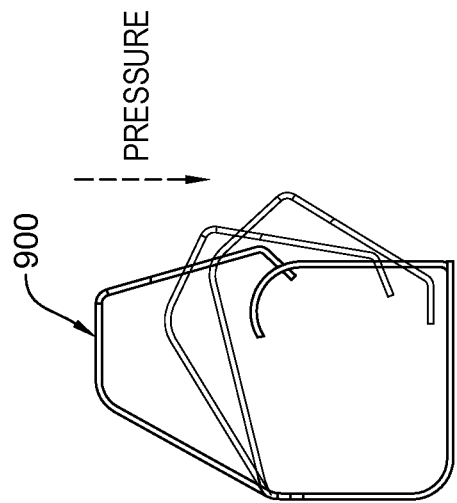
FIG. 9B is a schematic illustrating different compression states of the conductive pressure connector of FIG. 9A, in accordance with one or more aspects of the present invention.
Figure 9A:
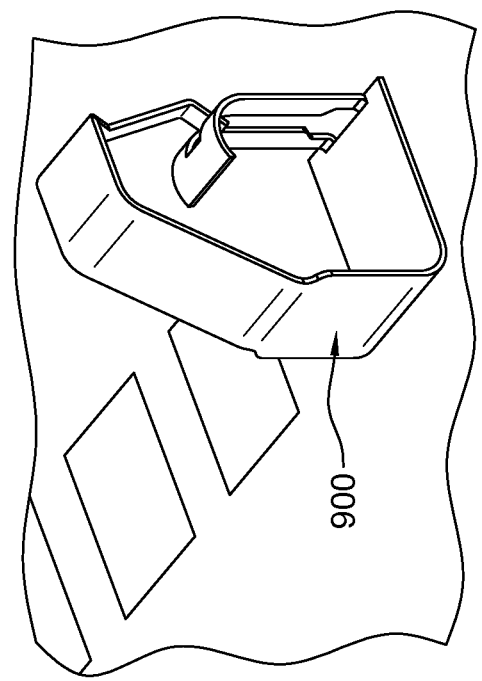
FIG. 9A depicts one embodiment of a conductive pressure connector of a pressure connector assembly for a tamper-respondent assembly, in accordance with one or more aspects of the present invention.
Figure 9D:
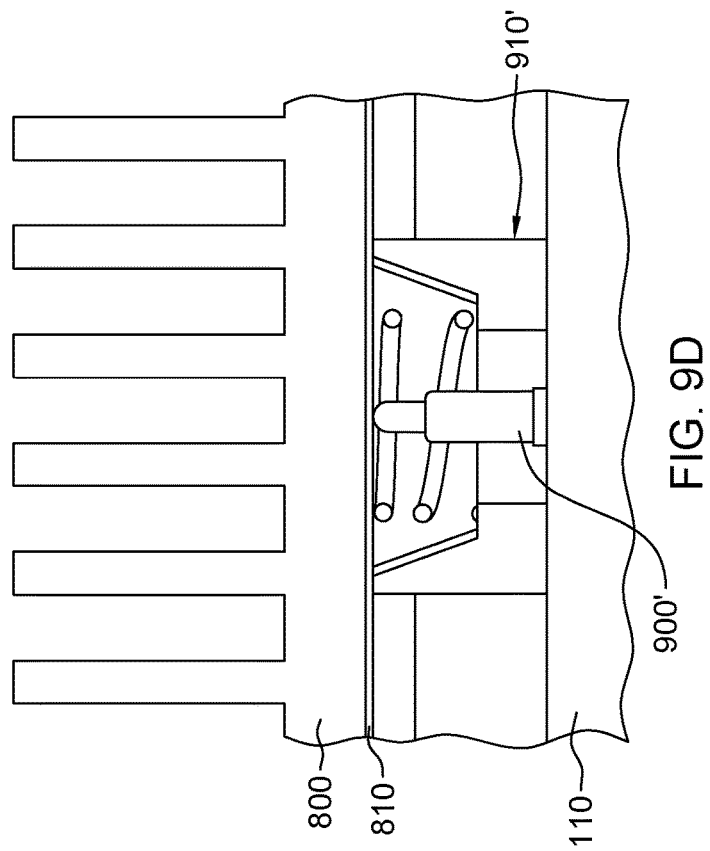
FIG. 9D depicts another embodiment of a pressure connector assembly in operative position within a tamper-respondent assembly, in accordance with one or more aspects of the present invention.
Figure 9C:
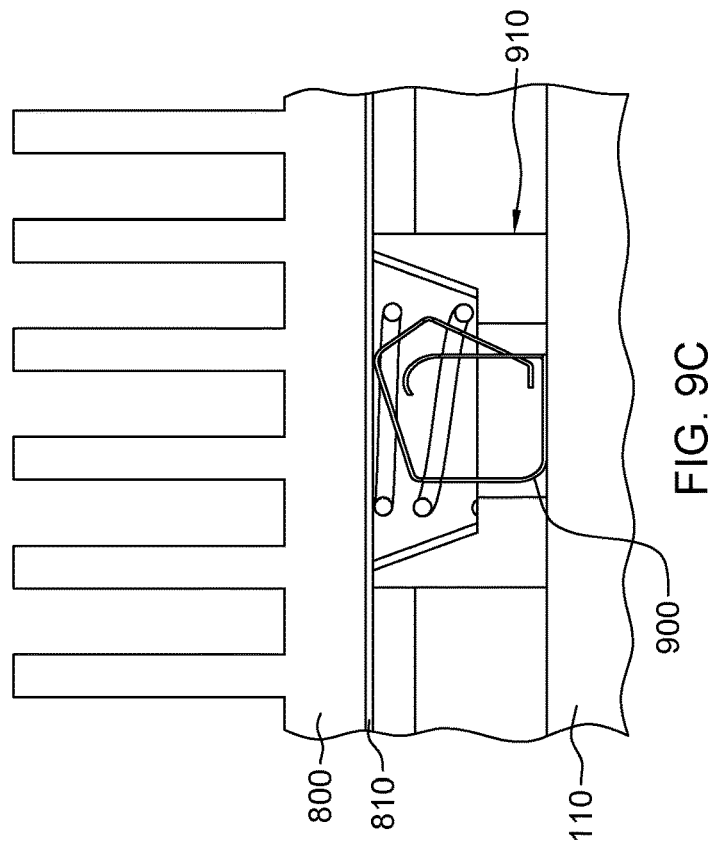
FIG. 9C is a cross-sectional elevational view of one embodiment of a pressure connector assembly in operative position within a tamper-respondent assembly, in accordance with one or more aspects of the present invention.

FIGS. 9A-9C depict one embodiment of a conductive pressure connector 900 for a pressure connector assembly 910 (FIG. 9C), such as disclosed herein. In the embodiment illustrated, conductive pressure connector 900 is configured to facilitate electrical connection between, for instance, an electrical contact pad on a surface of the circuit board 110 connected to the monitor circuit and a contact pad on a surface of the tamper-respondent sensor 810 covering, at least in part, the inner surface of the enclosure 800. In one embodiment, conductive pressure connector 900 can be formed of a metal or metal alloy, and be designed to compress with application of a mechanical pressure, as illustrated in FIG. 9B. Conductive pressure connector 900 is sized so that when bringing the enclosure into contact with the circuit board for mounting, the connector contacts a respective contact pad on the tamper-respondent sensor and compresses to an operative position, such as illustrated in FIG. 9C.

Note that a variety of conductive pressure connector configurations are possible, with FIG. 9D illustrating an alternate, pogo-type conductive pressure connector 900' which also compresses mechanically with mounting of enclosure 800 to circuit board 110, and in particular, with mechanical or physical coupling of the enclosure to the board, which results in the respective contact pad on tamper-respondent sensor 810 contacting the conductive pressure connector 900'. Note that a variety of pressure connectors can be used in a pressure connector assembly 910, 910' such as disclosed herein, with the embodiments of FIGS. 9A-9D being provided by way of example only. In each instance, the conductive pressure connector 900, 900' is electrically conductive and mechanically compressed, at least in part, when in operative position within the tamper-respondent assembly 910, 910'.

Figure 9E:
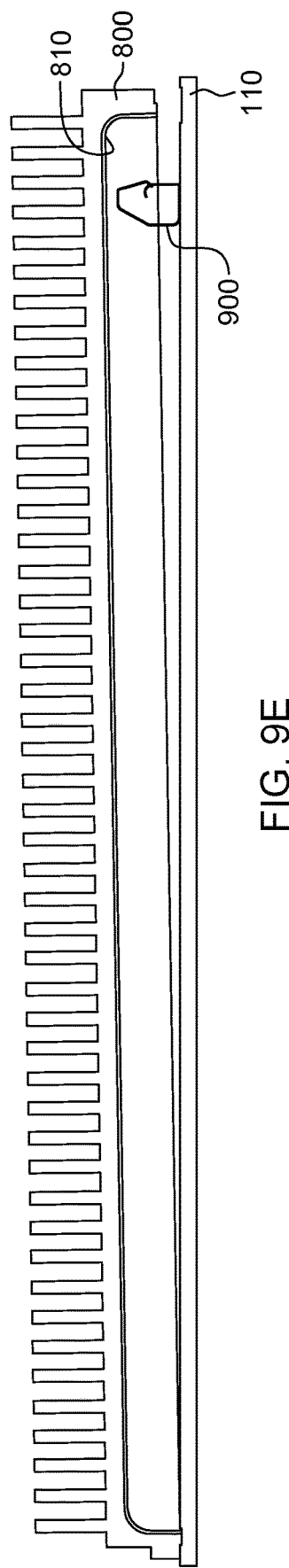
FIG. 9E is a cross-sectional elevational view of one embodiment of a tamper-respondent assembly showing breaking of electrical connection of the conductive pressure connector to a tamper-detect circuit with a tamper event, in accordance with one or more aspects of the present invention.

FIG. 9E is a cross-sectional elevational view of a tamper-respondent assembly, such as depicted in FIG. 8, with the connector cables and connectors depicted therein replaced by multiple pressure connector assemblies disposed, for instance, on different sides of the enclosure within the secure volume. As noted, the pressure connector assemblies facilitate electrically connecting the monitor circuit and one or more tamper-detect circuits of the tamper-respondent sensor over or on the inner surface of the enclosure, as described herein. Advantageously, the use of conductive pressure connector assemblies as disclosed improves the security design and tamper-detection of the tamper-respondent assembly due to the conductive pressure connector automatically losing connection when the enclosure is removed, even slightly, as illustrated in FIG. 9E, where enclosure 800 is removed slightly on the right side of the figure from contact with circuit board 110, resulting in an open circuit between the connector 900 and the tamper-respondent sensor 810. In one specific implementation, the working distance of a conductive pressure connector such as disclosed herein can be, for instance, from 5.1 mm to 4.2 mm (i.e., 4.65+/−0.45 mm). With such a design, if the enclosure were to be lifted from one side by about 0.6 degrees, or 1.35 mm, it would cause loss of contact at the adjacent conductive pressure connector(s), causing loss of connection and detection of the tamper event. Further, the pressure connector assemblies disclosed advantageously require less space on the circuit board, allowing additional components to be placed on the circuit board, and remove any need to route monitor cabling inside of the secure volume. Removing the need to route monitor cables within the secure volume greatly reduces the complexity of the manufacturing process for encapsulation, and also eliminates the possibility of having crossed wires that could short or cause a false tamper over time.

Figure 10:
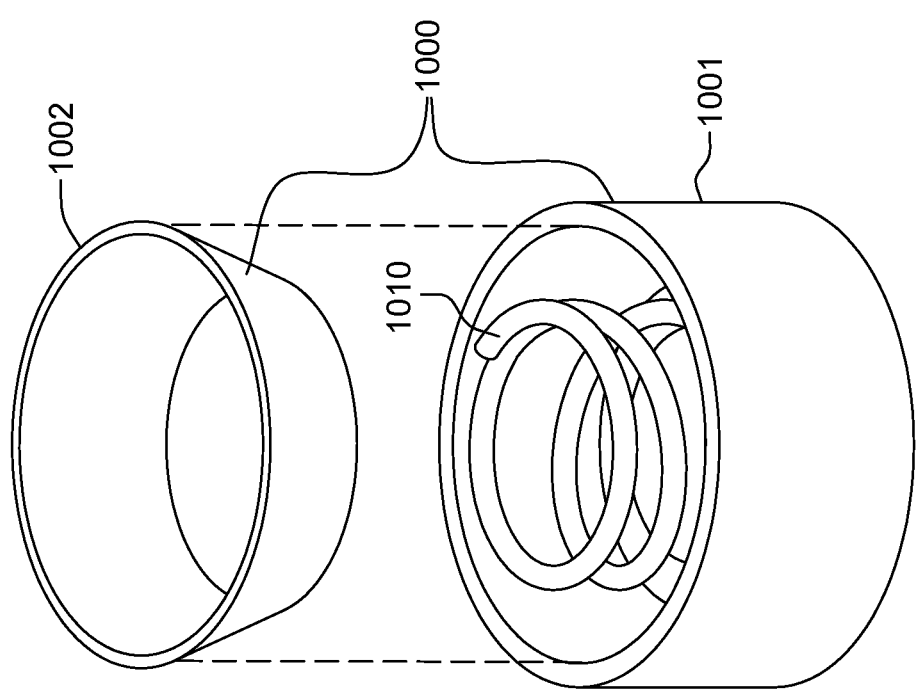
FIG. 10 is an exploded view of one embodiment of an alignment feature and spring-biasing mechanism of a pressure connector assembly, in accordance with one or more aspects of the present invention.

FIG. 10 is a partially exploded view of a spring-biasing mechanism and alignment feature of a pressure connector assembly 910, such as disclosed herein. As illustrated, in one embodiment, pressure connector assembly 910 includes a spring-biasing mechanism 1010 provided to facilitate breaking electrical connection of the conductive pressure connector (embodiments of which are shown in FIGS. 9C & 9D) to the at least one tamper-detect circuit with a tamper event, such as removal of the enclosure from the circuit board, or removal of that portion of the enclosure over the connector. Further, an alignment feature 1000 is provided which facilitates aligning the conductive pressure connector (not shown) to a contact pad of at least one tamper-detect circuit of the tamper-respondent sensor with mounting of the enclosure and sensor to the circuit board. In the embodiment illustrated, alignment feature 1000 includes a base alignment feature 1001, to be secured to the circuit board within the secure volume, and a circuit alignment feature 1002, to be secured to the tamper-respondent sensor within the secure volume. In one or more implementations, circuit alignment feature 1002 mates with base alignment feature 1001 with mounting of the enclosure to the circuit board to facilitate aligning the conductive pressure connector to the respective contact pad of the at least one tamper-detect circuit. In one or more embodiments, the conductive pressure connector of the pressure connector assembly can reside within central openings of base alignment feature 1001 and circuit alignment feature 1002, such as depicted in FIGS. 11A & 11B.

Figure 12B:
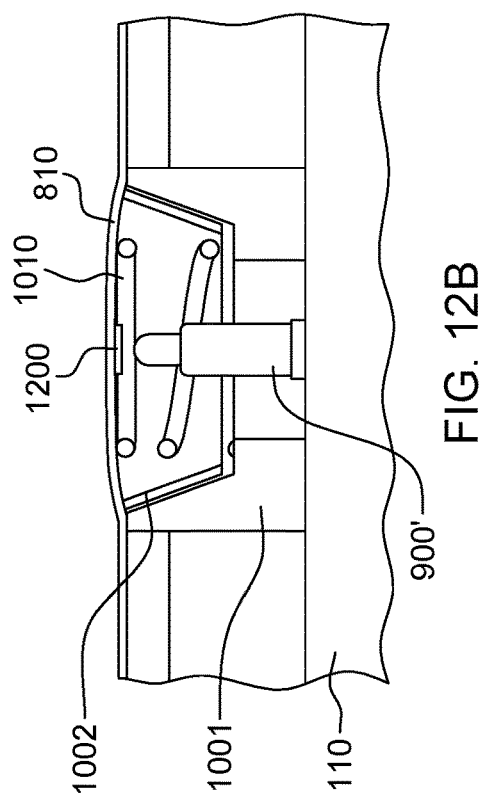
FIG. 12B depicts the partial cross-sectional elevational view of FIG. 12A, with the enclosure removed from over the tamper-respondent assembly above the pressure connector assembly, and showing breaking of electrical connection of the conductive pressure connector to the tamper-detect circuit, in accordance with one or more aspects of the present invention.

FIGS. 11A & 11B are substantially identical, with the exception being provision of a different type of conductive pressure connector, with conductive pressure connector 900 being depicted in FIG. 11A and pogo-type conductive pressure connector 900' being depicted in FIG. 11B, by way of example only. In the embodiments illustrated, circuit alignment feature 1002 is secured to the tamper-respondent sensor 810, by an adhesive, soldering, etc., with the spring-biasing mechanism 1010 residing, in one embodiment, within a central opening in circuit alignment feature 1002, as illustrated. In one implementation, circuit alignment feature 1002 is a conical-shaped structure, with an outer surface of circuit alignment feature slidably engaging an inner-angled surface of base alignment feature 1001 with mounting of enclosure 800 to circuit board 110. In one or more implementations, base alignment feature 1001 is secured to a surface of circuit board 110, and conductive pressure connector 900, 900' electrically connects to a respective contact pad on circuit board 110, to facilitate electrical connection of the monitor circuit within the secure volume to the tamper-detect circuit(s) of the tamper-respondent sensor 810. During assembly, spring-biasing mechanism 1010, which in one embodiment can be secured to tamper-respondent sensor 810, also contacts, in one embodiment, base alignment feature 1001 as the enclosure is mounted to the circuit board, and provides a counteracting spring-biasing against mounting of the enclosure 800 to circuit board 110. As explained above, a structural adhesive can be used, in one embodiment, to secure enclosure 800 to circuit board 110, and once secured, spring-biasing mechanism 1010 provides the counteracting spring-bias to the coupling, applying force in the opposite direction to the connection of the enclosure to the circuit board, which can advantageously facilitate tamper detection in the event that the enclosure is removed from over the tamper-respondent sensor 810 above the conductive pressure connector of the pressure connector assembly, as illustrated in FIGS. 12A-12B.

Figure 12A:
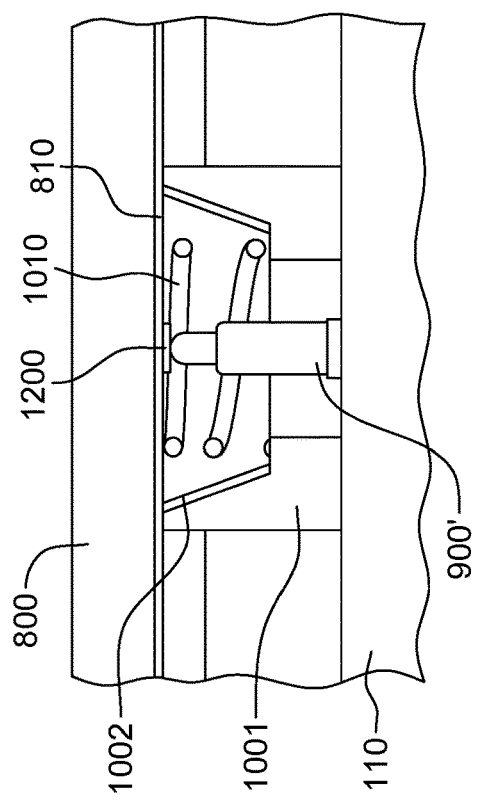
FIG. 12A is a partial cross-sectional elevational view of one embodiment of a tamper-respondent assembly with a pressure connector assembly in operative position within the secure volume, in accordance with one or more aspects of the present invention.

In FIG. 12A, a partial depiction of a tamper-respondent assembly embodiment is shown, with conductive pressure connector 900' partially mechanically compressed and forming electrical connection between monitor circuitry within the secure volume, and a contact pad 1200 electrically connected to the at least one tamper-detect circuit of tamper-respondent sensor 810. As illustrated, conductive pressure connector 900' can be configured and sized to reside, in one embodiment, in a central opening in base alignment feature 1001 and circuit alignment feature 1002, as well as extend through spring-biasing mechanism 1010. As illustrated in FIG. 12B, with a milling-type attack against the enclosure over the connector, spring-biasing mechanism 1010 provides additional security by forcing upwards tamper-respondent sensor 810 away from conductive pressure connector 900', breaking or open circuiting the electrical connection of the conductive pressure connector to the at least one tamper-detect circuit with the tamper event, thereby resulting in detection of the tamper event, and resulting in erasure of any confidential information within the secure volume. Note in this regard that although a spring is depicted as part of spring-biasing mechanism 1010, any elastomer or spring-biasing structure can be used to provide the upwards force against the tamper-respondent sensor with milling of the enclosure from above the sensor. The enclosure, which in one or more embodiments, can be a metal cover or heat sink (with our without thermally conductive fins) acts as a stiffener for the tamper-respondent sensor, and when removed, the spring-biasing mechanism deforms the tamper-respondent sensor away from the connector so that the connector no longer makes contact with the contact pad on the sensor, which causes an open circuit and thereby detection of the tamper event. Removal of the enclosure could occur by any number of tamper events, such as, for instance, milling-off the enclosure from over the pressure connector assembly, or using a chemical to remove the enclosure, which results in the same detection of the tamper event using pressure connector assemblies such as described herein.

Figure 13A:
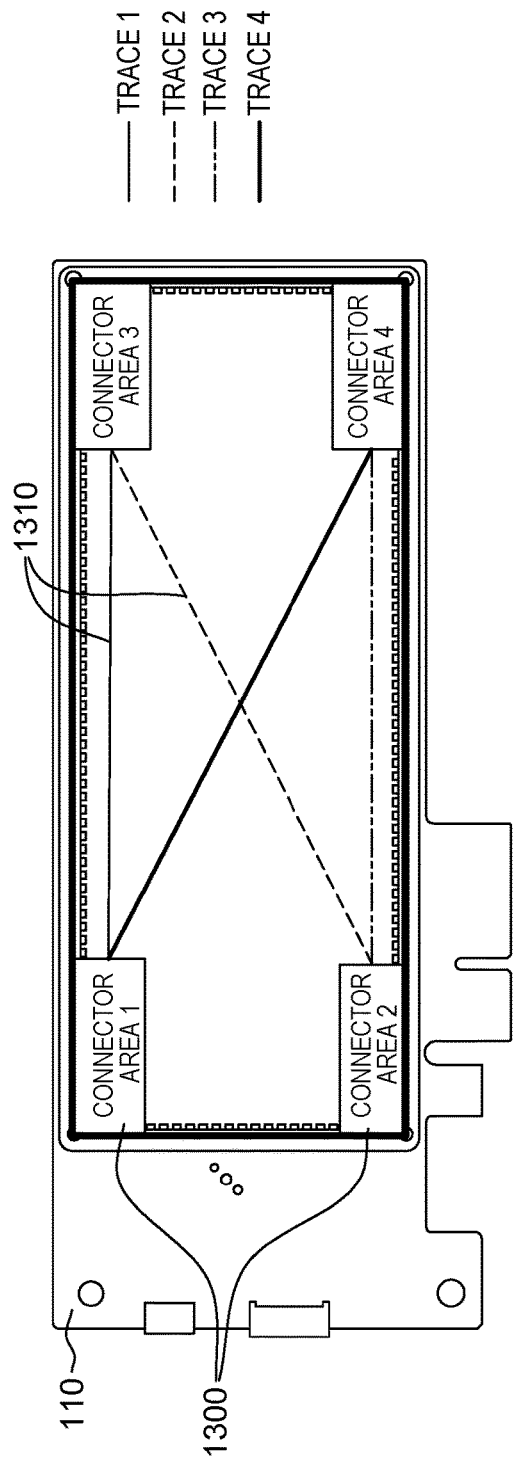
FIGS. 13A-13B schematically illustrate different embodiments of locations for pressure connector assemblies, in accordance with one or more aspects of the present invention.
Figure 13B:
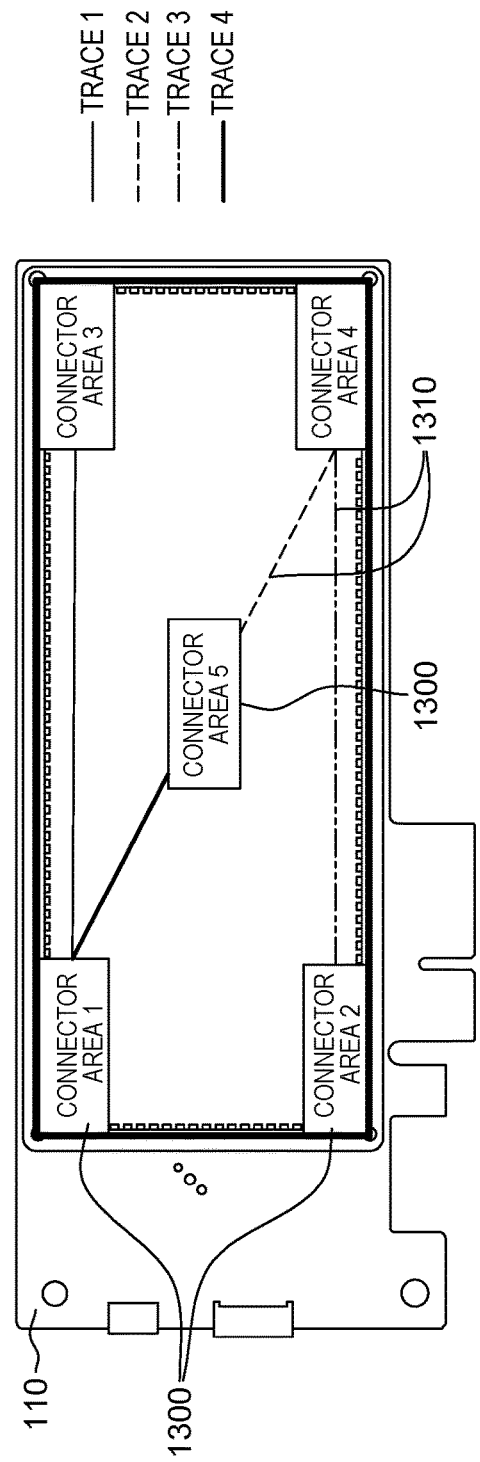

In one or more implementations, pressure connector assemblies such as disclosed herein can be dispersed throughout the secure volume, so that no matter the location of a tamper event, the pressure connector assemblies will provide an additional level of security. In one or more implementations, two connections, and thus, two pressure connector assemblies, can be used within the secure volume for each tamper-detect circuit to monitor circuit connection. Thus, for n tamper-detect circuits in a tamper-respondent sensor, 2n pressure connector assemblies can be provided within the secure volume. FIGS. 13A & 13B depict (by way of example only) possible layouts for placement of pressure connector assemblies such as disclosed herein.

Figure 14A:
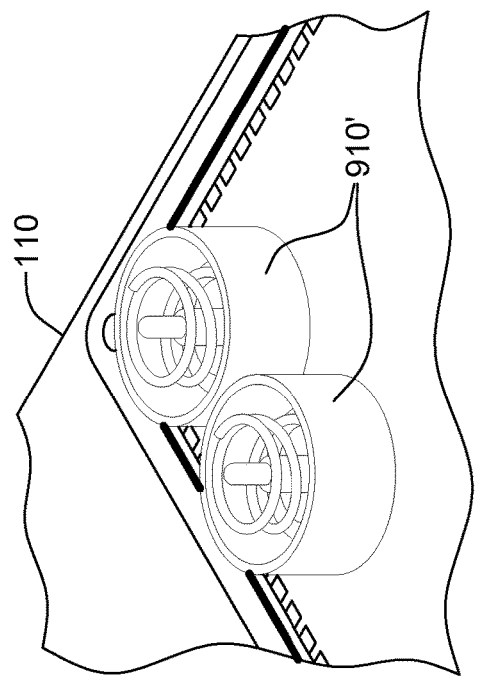
FIGS. 14A-14C illustrate partial embodiments of different numbers of pressure connector assemblies disposed within a selected connector area of a secure volume of a tamper-respondent assembly, in accordance with one or more aspects of the present invention.
Figure 14B:
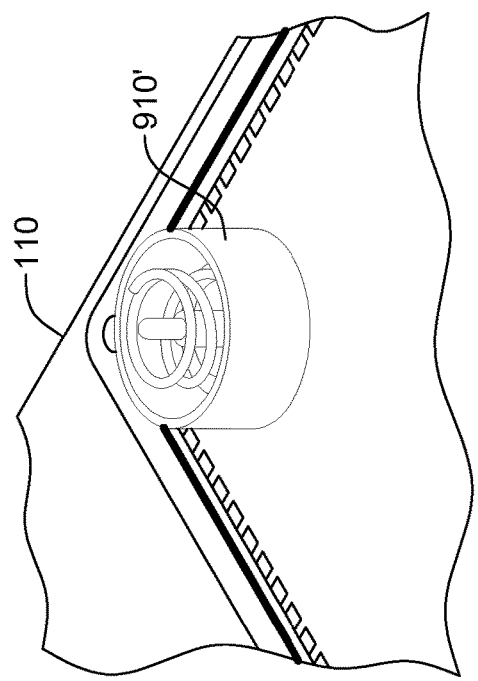
Figure 14C:
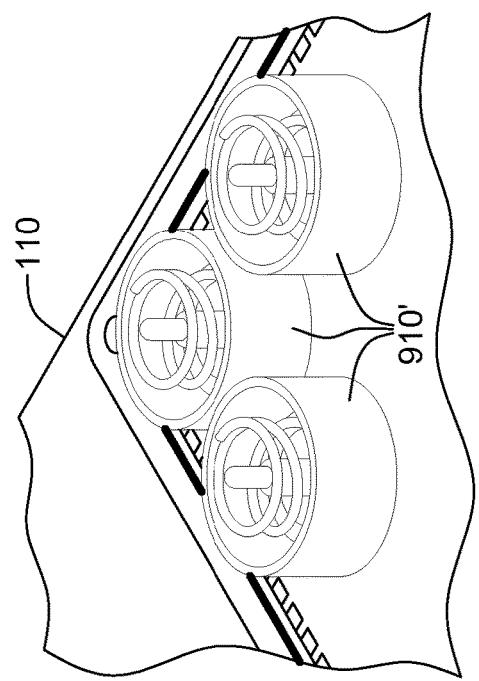

In FIG. 13A, the connector assemblies are placed in connector areas 1-4 1300 located at the four corners of the secure volume defined by the enclosure and tamper-respondent sensor being mounted to the multilayer circuit board 110. Further, in one implementation, conductive lines or traces 1310 are provided, interconnecting two or more of the conductive pressure connectors in a desired tamper-detect pattern. As illustrated in FIGS. 14A-14C, within each connector area 1300, one or more pressure connector assemblies, such as pressure connector assemblies 910' can be provided. For instance, where four pressure connector assemblies are required within the secure volume, each connector area 1300 can include a single pressure connector assembly, where eight are required, each connector area can include two connectors, and where 12 are required, each can include three pressure connector assemblies, such as depicted in FIGS. 14A-14C, respectively. In one or more embodiments, the different pressure connector assemblies for a single tamper-detect circuit or trace can be placed in different connector areas, such as opposite locations in the secure volume, so that no matter the area of the enclosure attacked, there is a pressure connector assembly for that trace located nearby, providing additional security to the tamper-respondent assembly.

FIG. 13B depicts another embodiment, where a further connector area location 1300 is disposed centrally within the secure volume. Note that the connector area locations of FIGS. 13A & 13B are provided by way of example only, and that the concepts disclosed herein are not limited to the particular connector locations illustrated. Also, note that the traces 1310 between connector areas, to electrically interconnect two or more pressure connector assemblies, can vary between implementations, as desired.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A tamper-respondent assembly comprising:
   an enclosure mounted to a circuit board and enclosing one or more components to be protected within a secure volume;
   a tamper-respondent sensor covering, at least in part, an inner surface of the enclosure, the tamper-respondent sensor comprising at least one tamper-detect circuit;
   a monitor circuit disposed within the secure volume to monitor the at least one tamper-detect circuit of the tamper-respondent sensor for tampering; and
   a pressure connector assembly disposed within the secure volume, between the tamper-respondent sensor and the circuit board, the pressure connector assembly comprising:
      a conductive pressure connector within the secure volume, and electrically connecting the circuit board and the tamper-respondent sensor of the tamper-respondent assembly; and
      a spring-biasing mechanism within the secure volume to facilitate breaking electrical connection of the conductive pressure connector to the tamper-respondent sensor with a tamper event.

2. The tamper-respondent assembly of claim 1, wherein the pressure connector assembly further comprises an alignment feature, the alignment feature facilitating aligning the conductive pressure connector to a contact pad of the at least one tamper-detect circuit of the tamper-respondent sensor.

3. The tamper-respondent assembly of claim 2, wherein the spring-biasing mechanism comprises a spring disposed within the alignment feature, the spring biasing the tamper-respondent sensor away from the conductive pressure connector with removal of the enclosure from over the tamper-respondent sensor above the conductive pressure connector.

4. The tamper-respondent assembly of claim 2, wherein the alignment feature comprises:
   a base alignment feature secured to the circuit board within the secure volume; and
   a circuit alignment feature coupled to the tamper-respondent sensor within the secure volume, the circuit alignment feature mating with the base alignment feature with mounting of the enclosure to the circuit board to facilitate aligning the conductive pressure connector to the contact pad of the at least one tamper-detect circuit.

5. The tamper-respondent assembly of claim 4, wherein the spring-biasing mechanism comprises a spring residing between the base alignment feature and the tamper-respondent sensor.

6. The tamper-respondent assembly of claim 4, wherein the base alignment feature has a central alignment opening, and the circuit alignment feature projects into the central alignment opening of the base alignment feature with mounting of the enclosure to the circuit board to facilitate aligning the conductive pressure connector to the contact pad of the at least one tamper-detect circuit.

7. The tamper-respondent assembly of claim 6, wherein the circuit alignment feature comprises a conical-shaped alignment feature, and the conductive pressure connector extends through a central opening in the conical-shaped alignment feature to contact the contact pad of the at least one tamper-detect circuit.

8. The tamper-respondent assembly of claim 2, wherein the conductive pressure connector resides within a central opening in the alignment feature of the pressure connector assembly.

9. The tamper-respondent assembly of claim 8, wherein the conductive pressure connector further resides, at least in part, within a central opening in the spring-biasing mechanism.

10. The tamper-respondent assembly of claim 1, further comprising multiple pressure connector assemblies disposed within the secure volume, between the tamper-respondent sensor and the circuit board, the pressure connector assembly being one pressure connector assembly of the multiple pressure connector assemblies, and wherein the one pressure connector assembly further comprises an alignment feature, the alignment feature facilitating aligning the conductive pressure connector to a contact pad of the at least one tamper-detect circuit of the tamper-respondent sensor, and comprising a base alignment feature, and the spring-biasing mechanism comprising a spring disposed between the base alignment feature and the tamper-respondent sensor.

11. A tamper-respondent assembly comprising:
   an enclosure mounted to a circuit board and enclosing one or more components to be protected within a secure volume;
   a tamper-respondent sensor covering, at least in part, an inner surface of the enclosure, the tamper-respondent sensor comprising at least one tamper-detect circuit;
   a monitor circuit disposed within the secure volume to monitor the at least one tamper-detect circuit of the tamper-respondent sensor for tampering; and
   multiple pressure connector assemblies disposed within the secure volume, between the tamper-respondent sensor and the circuit board, a pressure connector assembly of the multiple pressure connector assemblies comprising:
      a conductive pressure connector within the secure volume, and electrically connecting the circuit board to the tamper-respondent sensor of the tamper-respondent assembly; and a spring-biasing mechanism within the secure volume to facilitate breaking electrical connection of the conductive pressure connector to the tamper-respondent sensor with a tamper event.

12. The tamper-respondent assembly of claim 11, wherein the pressure connector assembly further comprises an alignment feature, the alignment feature facilitating aligning the conductive pressure connector to a contact pad of the at least one tamper-detect circuit of the tamper-respondent sensor.

13. The tamper-respondent assembly of claim 12, wherein the spring-biasing mechanism comprises a spring disposed within the alignment feature, the spring biasing the tamper-respondent sensor away from the conductive pressure connector with removal of the enclosure from over the tamper-respondent sensor above the conductive pressure connector.

14. The tamper-respondent assembly of claim 12, wherein the alignment feature comprises:
   a base alignment feature secured to the circuit board within the secure volume; and
   a circuit alignment feature coupled to the tamper-respondent sensor within the secure volume, the circuit alignment feature mating with the base alignment feature with mounting of the enclosure to the circuit board to facilitate aligning the conductive pressure connector to the contact pad of the at least one tamper-detect circuit.

15. The tamper-respondent assembly of claim 14, wherein the spring-biasing mechanism comprises a spring residing between the base alignment feature and the tamper-respondent sensor.

16. The tamper-respondent assembly of claim 12, wherein the conductive pressure connector resides within a central opening in the alignment feature of the pressure connector assembly.

17. The tamper-respondent assembly of claim 16, wherein the conductive pressure connector further resides, at least in part, within a central opening in the spring-biasing mechanism.

18. A method of fabricating a tamper-respondent assembly, the method comprising:
   obtaining a circuit board, the circuit board including one or more electronic components to be protected;
   mounting an enclosure to the circuit board to enclose the one or more electronic components within a secure volume;
   providing a tamper-respondent sensor covering, at least in part, an inner surface of the enclosure, the tamper-respondent sensor comprising at least one tamper-detect circuit;
   providing a monitor circuit disposed within the secure volume to monitor the at least one tamper-detect circuit of the tamper-respondent sensor for tampering; and
   providing a pressure connector assembly disposed within the secure volume, between the tamper-respondent sensor and the circuit board, the pressure connector assembly comprising:
      a conductive pressure connector within the secure volume, and electrically connecting the circuit board and the tamper-respondent sensor of the tamper-respondent assembly; and
      a spring-biasing mechanism within the secure volume to facilitate breaking electrical connection of the conductive pressure connector to the tamper-respondent sensor with a tamper event.

19. The method of claim 18, wherein providing the pressure connector assembly further comprises providing an alignment feature, the alignment feature facilitating aligning the conductive pressure connector to a contact pad of the at least one tamper-detect circuit of the tamper-respondent sensor.

20. The method of claim 19, wherein the spring-biasing mechanism comprises a spring disposed within the alignment feature, the spring biasing the tamper-respondent sensor away from the conductive pressure connector with removal of the enclosure from over the tamper-respondent sensor above the conductive pressure connector.

* * * * *